(12) United States Patent
Sato et al.

(10) Patent No.: US 10,281,323 B2
(45) Date of Patent: May 7, 2019

(54) LIGHT RECEIVER AND PORTABLE ELECTRONIC APPARATUS

(71) Applicant: SHARP KABUSHIKI KAISHA, Sakai, Osaka (JP)

(72) Inventors: Hideki Sato, Sakai (JP); Takayuki Shimizu, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 132 days.

(21) Appl. No.: 15/549,084

(22) PCT Filed: Sep. 30, 2015

(86) PCT No.: PCT/JP2015/077659
§ 371 (c)(1),
(2) Date: Aug. 4, 2017

(87) PCT Pub. No.: WO2016/143178
PCT Pub. Date: Sep. 15, 2016

(65) Prior Publication Data
US 2018/0038731 A1    Feb. 8, 2018

(30) Foreign Application Priority Data

Mar. 10, 2015 (JP) ................. 2015-047419

(51) Int. Cl.
*G01J 1/42* (2006.01)
*G01J 1/44* (2006.01)
(Continued)

(52) U.S. Cl.
CPC ............ *G01J 1/429* (2013.01); *G01J 1/0295* (2013.01); *G01J 1/0433* (2013.01); *G01J 1/32* (2013.01);
(Continued)

(58) Field of Classification Search
CPC ........ G01J 1/429; G01J 1/0295; G01J 1/0433; G01J 1/32; G01J 1/4228; G01J 1/44; H01L 27/14647; H01L 31/10
(Continued)

(56) References Cited

U.S. PATENT DOCUMENTS

| 5,130,776 A | 7/1992 | Popovic et al. |
| 8,294,231 B2 | 10/2012 | Kawai |

(Continued)

FOREIGN PATENT DOCUMENTS

| CN | 106104232 A | 11/2016 |
| JP | 2-278883 A | 11/1990 |

(Continued)

OTHER PUBLICATIONS

JP 2013-140098 English Translation (Year: 2013).*
JP 2013-050422 English Translation (Year: 2013).*

*Primary Examiner* — David P Porta
*Assistant Examiner* — Abra S Fein
(74) *Attorney, Agent, or Firm* — Birch, Stewart, Kolasch & Birch, LLP

(57) ABSTRACT

There is provided a light receiver which corrects measurement of ultraviolet rays on the basis of measurement of visible right and infrared rays. The light receiver is a light receiver (1) including a first light-receiving element (PD1) and a second light-receiving element (PD2), and a UV cutoff filter (11) in which transmittance of light in an ultraviolet region is lower, in which light after passage through the UV cutoff filter (11) enters the first light-receiving element (PD1), and the first light-receiving element (PD1) and the second light-receiving element (PD2) are switchable between a photodiode (PD_uv) having sensitivity to the ultraviolet region and a photodiode (PD_clear) having sensitivity to a visible light region and an infrared region. Unevenness in incident light is calculated from photocur- (Continued)

rents in photodiodes (PD_ir+PD_vis) of the first light-receiving element (PD1) and the second light-receiving element (PD2).

5 Claims, 18 Drawing Sheets

(51) Int. Cl.
*H01L 31/10* (2006.01)
*G01J 1/02* (2006.01)
*G01J 1/04* (2006.01)
*G01J 1/32* (2006.01)
*H01L 27/146* (2006.01)

(52) U.S. Cl.
CPC ............... *G01J 1/4228* (2013.01); *G01J 1/44* (2013.01); *H01L 27/14647* (2013.01); *H01L 31/10* (2013.01)

(58) Field of Classification Search
USPC .......................................................... 250/372
See application file for complete search history.

(56) References Cited

U.S. PATENT DOCUMENTS

| | | | |
|---|---|---|---|
| 2008/0067330 A1* | 3/2008 | Yamamoto | G01J 3/51 250/226 |
| 2009/0243019 A1 | 10/2009 | Kawai | |
| 2009/0322233 A1* | 12/2009 | Sone | G01J 1/32 315/158 |
| 2013/0050068 A1 | 2/2013 | Inoue et al. | |
| 2013/0256513 A1 | 10/2013 | Kitade | |
| 2016/0109287 A1 | 4/2016 | Kitade | |
| 2017/0138786 A1 | 5/2017 | Shimizu et al. | |

FOREIGN PATENT DOCUMENTS

| | | | |
|---|---|---|---|
| JP | 2006-71581 | A | 3/2006 |
| JP | 2007-67331 | A | 3/2007 |
| JP | 2009-239003 | A | 10/2009 |
| JP | 2010-112714 | A | 5/2010 |
| JP | 2013-050422 | * | 3/2013 |
| JP | 2013-50422 | A | 3/2013 |
| JP | 5189391 | B2 | 4/2013 |
| JP | 2013-140098 | * | 7/2013 |
| JP | 2013-197243 | A | 9/2013 |
| JP | 2014-112048 | A | 6/2014 |

* cited by examiner

LIGHT RECEIVER AND PORTABLE ELECTRONIC APPARATUS

TECHNICAL FIELD

The present invention relates to a light receiver and a portable electronic apparatus.

BACKGROUND ART

Along with recent miniaturization of cameras, proximity sensors, direction sensors, acceleration sensors, angular rate sensors, illuminance sensors, and the like, portable electronic apparatuses, such as a smartphone, are equipped with various sensors as described above. Especially, an electronic apparatus having a liquid crystal panel can measure ambient brightness with an illuminance sensor and appropriately adjust the luminance of a backlight in accordance with the ambient brightness. For implementation of illuminance measurement with a spectral sensitivity characteristic close to visual sensitivity, a technique is known for providing a plurality of photodiodes different in spectral sensitivity characteristic in an illuminance sensor and computing photocurrents in the photodiodes.

Wristwatch-type terminals and eyeglass-type portable electronic apparatuses as terminals secondary to a smartphone are in practical use, and there is already an environment in which biological information, such as a heart rate and the amount of exercise, of a wearer can be monitored and managed at all times. By equipping a portable electronic apparatus of this type to be used outdoors with an ultraviolet sensor and measuring the intensity of ultraviolet rays contained in sunlight, it is possible to promote prevention of sunburn and record the cumulative amount of ultraviolet rays in the daytime. This allows management of health information of a user with use of a portable electronic apparatus.

PTL 1 discloses an ultraviolet measurement apparatus including separate light receivers, separate voltage detection circuits, and separate optical sensor windows for a UV sensor and an illuminance sensor. PTL 2 discloses an optical sensor into which a visible light sensor and an ultraviolet sensor are integrated using an SOI substrate.

In order to minimize optical sensor windows and improve design in a portable electronic apparatus including an illuminance sensor and an ultraviolet sensor, an attempt has been made to cause a single common sensor window to function as a sensor window for the ultraviolet sensor and a sensor window for the illuminance sensor. A photodiode using a GaN-based or ZnO-based compound semiconductor and an SOI substrate has generally been used to detect ultraviolet rays. The use of the compound semiconductor and the SOI substrate leads to the difficulty of integration with a signal processing IC on a single chip and a high cost.

There is a method that measures the intensity and illuminance of ultraviolet rays by arranging a UV (ultraviolet) cutoff filter above one of two light-receiving elements structured such that a plurality of junction photodiodes having different spectral sensitivity characteristics are arrayed in a vertical direction and calculating a difference in signal intensity between the two light-receiving elements.

The difference method allows implementation of provision of an ultraviolet light receiver at low cost. A PN junction photodiode at an outermost surface which has sensitivity to an ultraviolet region is used to receive ultraviolet rays. Since a UV cutoff filter transmits visible light and infrared light, use of a PN junction photodiode at a deep position which has sensitivity to a visible light region or an infrared region allows measurement of illuminance.

Additionally, since the difference method can use a general-purpose silicon substrate, cost can be reduced through integration with a sensor circuit formed by a silicon complementary metal-oxide semiconductor (CMOS) process on a single chip. In addition, ultraviolet rays and illuminance are detected with light-receiving elements as described above which are structured such that a plurality of junction photodiodes are arrayed in the vertical direction, and optical sensor windows for an ultraviolet sensor and an illuminance sensor of a portable electronic apparatus, such as a smartphone, can be integrated into a single common optical sensor window.

Meanwhile, in the case of a light receiver which does not use the difference method and uses a filter transmitting light in the ultraviolet region, it is generally difficult to make sensitivity to a wavelength not less than 400 nm absolutely zero. If an interference film filter is used as a filter transmitting light in the ultraviolet region, the number of layers is larger, and the cost is higher, compared to the case of a UV cutoff filter.

In a case without the difference method, since a filter transmitting only light in the ultraviolet region is used, light in the visible light region is hardly transmitted. For this reason, an optical sensor window for an illuminance sensor needs to be prepared separately from an optical sensor window for an ultraviolet sensor to detect visible right in a wavelength range of 400 nm to 700 nm for the illuminance sensor.

In the field of illuminance sensors, a method that computes photocurrents in a plurality of photodiodes different in spectral characteristic is generally performed to achieve a spectral characteristic close to visual sensitivity. A cross-sectional view of a conventional illuminance sensor using the above-described method is shown in FIG. 24, and a spectral sensitivity characteristic of the conventional illuminance sensor is shown in FIG. 25.

As shown in FIG. 24, the illuminance sensor includes two light-receiving elements (PD1 and PD2) different in spectral sensitivity. The light-receiving element PD1 and the light-receiving element PD2 each have a three-layer structure with a P-type diffusion layer (P+), an N-type well layer (N-Well), and a P-type substrate (P-Sub) and include two photodiodes (PD_vis and PD_ir) composed of a PN junction. In the light-receiving element PD1, the P+ layer and the P-Sub are grounded (GND). In the light-receiving element PD2, the P-Sub is grounded, and the P+ layer and the N-Well layer are connected to each other.

As shown in FIG. 25, a spectral sensitivity characteristic denoted by PD_clear (PD_vis+PD_ir) is achieved by the light-receiving element PD1, and a spectral sensitivity characteristic denoted by PD_ir is achieved by the light-receiving element PD2. Computation of PD1 (PD_ clear)−PD2 (PD_ir) allows calculation of a spectral sensitivity characteristic corresponding to PD_vis. The spectral sensitivity characteristic is a characteristic close in peak sensitivity to visual sensitivity, and illuminance can be measured.

It is ideal for an ultraviolet sensor and an illuminance sensor using the above-described difference method that light evenly enters a plurality of light-receiving elements.

Unevenness of radiated light due to an angle for light to be radiated can be reduced to a certain degree by arranging the light-receiving elements such that the light-receiving elements are evenly distributed. However, since the arrangement of the light-receiving elements is fixed, radiated light becomes uneven due to, for example, the angle for light to be radiated and a package surface state when the sensors are sealed with resin to cause variation in spectral sensitivity characteristic. For example, in the case of the illuminance sensor shown in FIG. 24, illuminance is computed through subtraction for output currents from the light-receiving elements PD1 and PD2. If light radiated to the light-receiving elements PD1 and PD2 is uneven, illuminance measurement is unevenly performed to cause variation in spectral sensitivity characteristic.

PTL 3 discloses a method for measurement without unevenness in measurement results and variation in sensitivity by interchanging spectral characteristics for two light-receiving elements arranged at predetermined positions during measurement. For example, a light-receiving element PD1 and a light-receiving element PD2 are respectively set to have the spectral characteristic denoted by PD_ir and the spectral characteristic denoted by PD_clear during a first measurement time period, and the light-receiving element PD1 and the light-receiving element PD2 are respectively set to have the spectral characteristic denoted by PD_clear and the spectral characteristic denoted by PD_ir during a second measurement time period.

PTL 4 discloses a method for correcting measurement unevenness and variation in sensitivity using a corrective photodiode in ultraviolet intensity measurement.

CITATION LIST

Patent Literature

PTL 1: Japanese Unexamined Patent Application Publication No. 2010-112714 (laid-open on May 20, 2010)
PTL 2: Japanese Patent No. 5189391 (issued on Apr. 24, 2013)
PTL 3: Japanese Unexamined Patent Application Publication No. 2013-50422 (laid-open on Mar. 14, 2013)
PTL 4: Japanese Unexamined Patent Application Publication No. 2014-112048 (laid-open on Jun. 19, 2014)

SUMMARY OF INVENTION

Technical Problem

Since arrangement of light-receiving elements is fixed, radiated light becomes uneven due to, for example, an angle for light to be radiated and a package surface state when sensors are sealed with resin to cause variation in spectral sensitivity characteristic. PTL 3 and PTL 4 described above disclose attempts to ameliorate the above-described problems but suffer from the problems below.

The configuration of an illuminance sensor described in PTL 3 above is applicable only to a case where wavelength distributions of light incident on two light-receiving elements arranged at predetermined positions are the same. That is, the configuration is applicable only to a case where an optical filter is provided at neither of the two light-receiving elements arranged at the predetermined positions and a case where the same optical filters are provided at the two light-receiving elements.

Thus, the configuration is not applicable to an ultraviolet sensor using the difference method in which a UV cutoff filter is arranged only for one light-receiving element. This is because the method is a method that measures the intensity of ultraviolet rays by arranging a UV cutoff filter above one of two light-receiving elements and calculating a difference in signal intensity between the two light-receiving elements, and the position of the UV cutoff filter cannot be changed at the time of switching from a first measurement time period to a second measurement time period.

The configuration of an ultraviolet sensor described in PTL 4 above requires provision of a photodiode for correction, aside from a photodiode for ultraviolet measurement. This invites an increase in cost and an increase in optical sensor formation area.

An object of the present invention is to provide a light receiver capable of curbing an increase in cost and an increase in light-receiving element formation area and calculating unevenness in incident light.

Solution to Problem

A light receiver according to the present invention is a light receiver including first and second light-receiving elements that each feed a photocurrent in accordance with intensity of incident light and an optical filter in which transmittance of light in a first wavelength range is lower than transmittance of light outside the first wavelength range, in which the incident light after passage through the optical filter enters the first light-receiving element, the first and second light-receiving elements are arranged adjacent to each other and are switchable between a first state with sensitivity to light in the first wavelength range and a second state with sensitivity to light outside the first wavelength range, and a ratio between a first value that is a sum of photocurrents in the first and second light-receiving elements in the second state and a second value that is a photocurrent in the first or second light-receiving element in the second state is calculated as a value of unevenness in the incident light.

According to the above-described configuration, the first and second light-receiving elements can measure intensity of the incident light in the second state with sensitivity to light outside the first wavelength range. For this reason, unevenness in incident light on each of the first and second light-receiving elements outside the first wavelength range can be calculated.

The first and second light-receiving elements can measure the intensity of the incident light both in the first state with sensitivity to light in the first wavelength range and in the second state with sensitivity to light outside the first wavelength range. For this reason, a light-receiving element for measuring the unevenness in the incident light need not be provided separately from a light-receiving element for measuring the intensity of the incident light. This allows curbing of an increase in cost and an increase in light-receiving element formation area.

Advantageous Effects of Invention

According to one aspect of the present invention, provision of a light receiver capable of curbing an increase in cost and an increase in light-receiving element formation area and calculating unevenness in incident light can be implemented.

DESCRIPTION OF EMBODIMENTS

Embodiments of the present invention will be described below in detail with reference to FIGS. 1 to 23. Note that the dimensions, the materials, the shapes, the relative arrangement, and the like of component parts described in the embodiments are illustrative only and are not intended to limit the scope of the invention.

First Embodiment

An embodiment of the present invention will be described below with reference to FIGS. 1 to 18.

Figure 1:
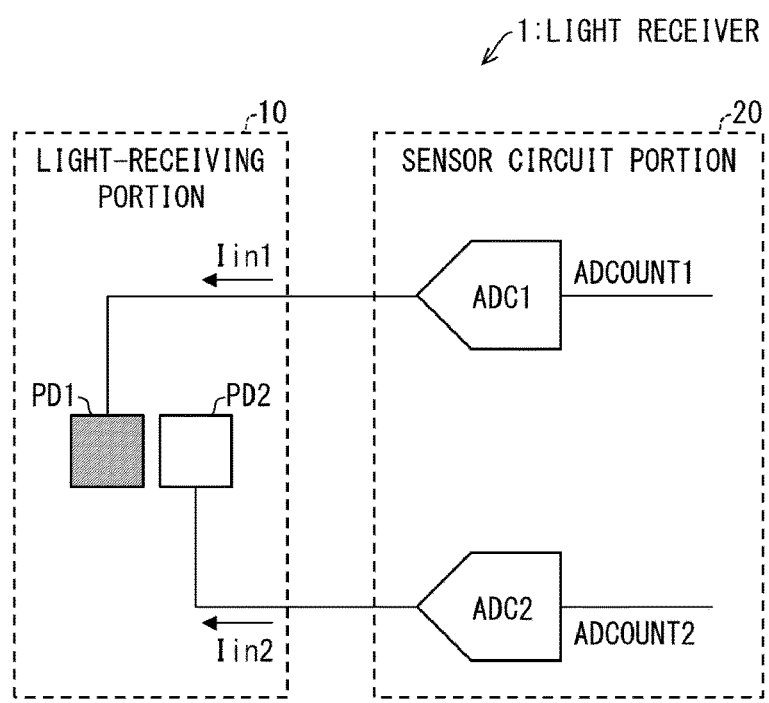
FIG. 1 is a block diagram showing the configuration of a light receiver according to a first embodiment.

FIG. 1 is a block diagram showing the configuration of a light receiver 1 according to the present embodiment. The light receiver 1 includes a light-receiving portion 10 which feeds a photocurrent when light enters the light receiver 1 and a sensor circuit portion 20 which detects the intensity of the light on the basis of the photocurrent. The light receiver 1 can be loaded into a portable electronic apparatus, such as a smartphone.

<Light-Receiving Portion>

Figure 2:
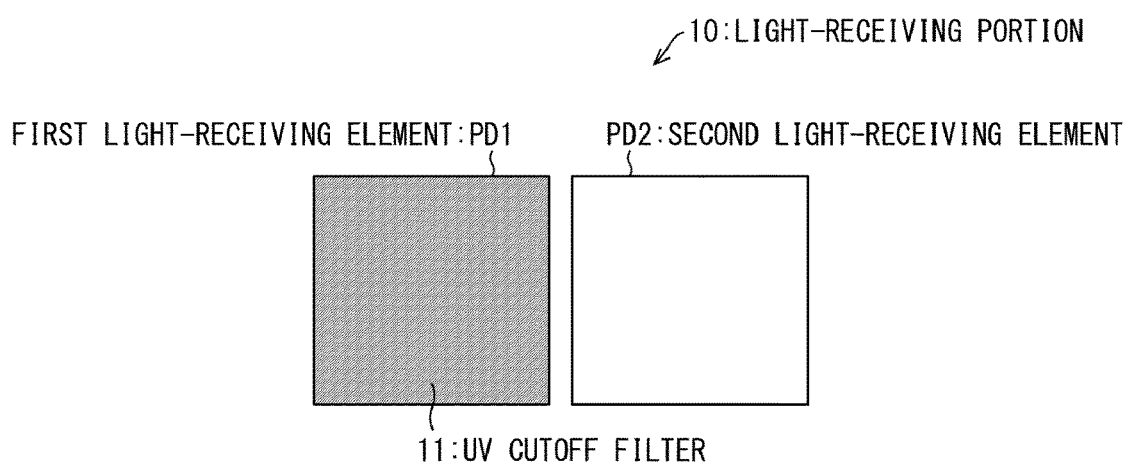
FIG. 2 is a plan view of a light-receiving portion shown in FIG. 1.

FIG. 2 is a plan view of the light-receiving portion 10 shown in FIG. 1. The light-receiving portion 10 includes a first light-receiving element PD1 and a second light-receiving element PD2 which are arranged adjacent to each other in plan view and a UV cutoff filter 11 (an ultraviolet cutoff filter or an optical filter) which is provided above the first light-receiving element PD1. The first light-receiving element PD1 feeds a photocurrent Iin1 in accordance with the intensity of incident light while the second light-receiving element PD2 feeds a photocurrent Iin2 in accordance with the intensity of incident light.

Figure 3:
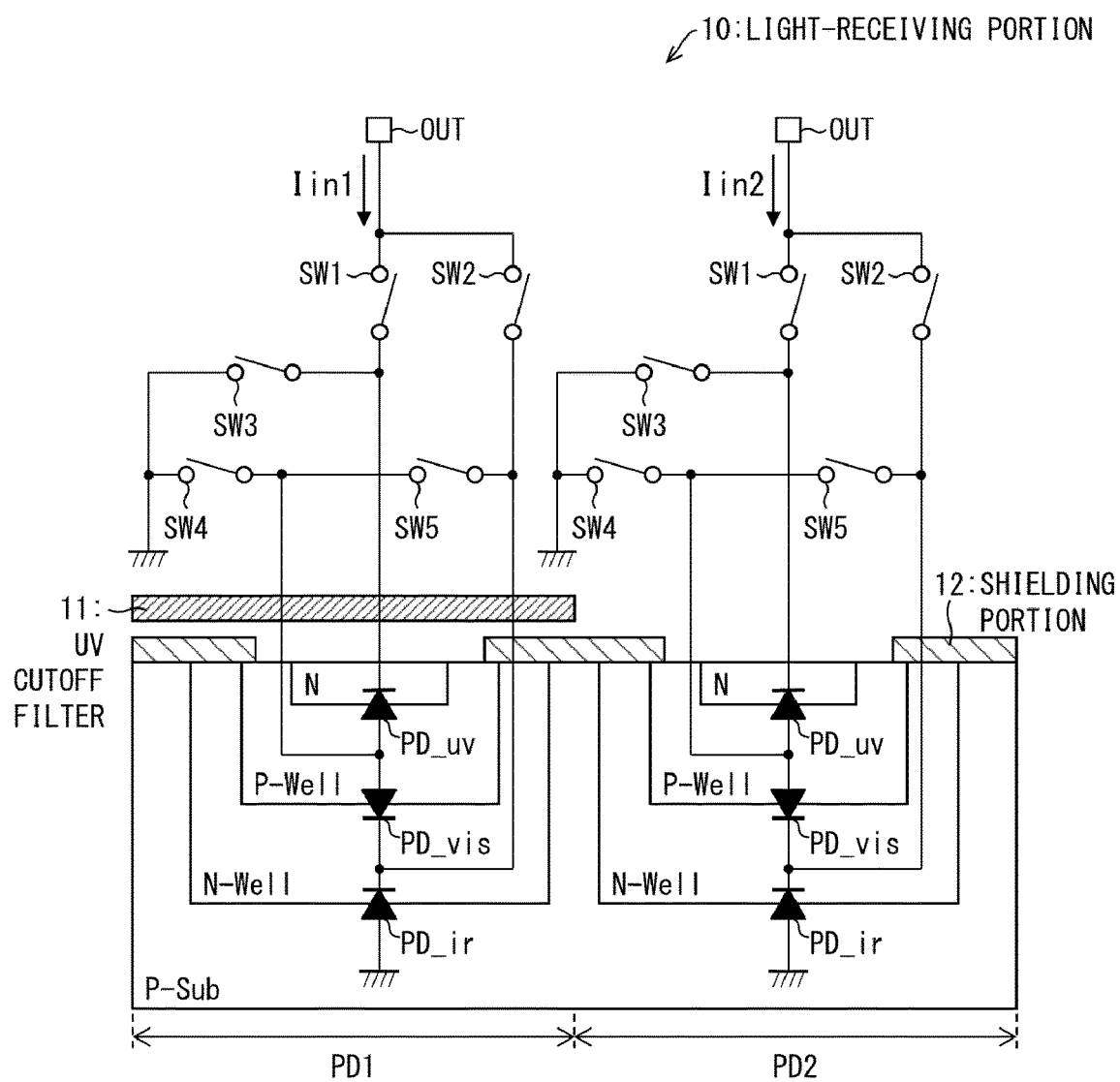
FIG. 3 is a cross-sectional view of the light-receiving portion shown in FIG. 1.

FIG. 3 is a cross-sectional view of the light-receiving portion 10 shown in FIG. 1. As shown in FIG. 3, the light-receiving portion 10 includes the first light-receiving element PD1, the second light-receiving element PD2, the UV cutoff filter 11, and a shielding portion 12. With this configuration, light after passage through the UV cutoff filter 11 enters the first light-receiving element PD1.

The first light-receiving element PD1 and the second light-receiving element PD2 have the same cross-sectional structure and each include a P-type substrate P-Sub (a substrate), an N-type well layer N-Well (a third layer) which is formed on the P-type substrate P-Sub, a P-type well layer P-Well (a second layer) which is formed on the N-type well layer N-Well, and an N-type diffusion layer N (a first layer) which is formed on the P-type well layer P-Well. The first light-receiving element PD1 and the second light-receiving element PD2 have the same switching structure and each include five switches SW1 to SW5.

(Cross-Sectional Structure of Light-Receiving Element)

The first light-receiving element PD1 and the second light-receiving element PD2 each have three PN junctions (photodiode junctions) and include a photodiode PD_ir which is composed of a PN junction between the P-type substrate P-Sub and the N-type well layer N-Well, a photodiode PD_vis which is composed of a PN junction between the N-type well layer N-Well and the P-type well layer P-Well, and a photodiode PD_uv which is composed of a PN junction between the P-type well layer P-Well and the N-type diffusion layer N.

The UV cutoff filter 11 is an optical filter in which the transmittance of light in a wavelength range for ultraviolet rays (covering wavelengths not more than 400 nm) is lower than the transmittance of light outside the wavelength range for ultraviolet rays. The UV cutoff filter 11 preferably blocks light in the wavelength range for ultraviolet rays (a first wavelength range).

The shielding portion 12 is provided so as to expose the N-type diffusion layers N as uppermost layers at upper surfaces of the first light-receiving element PD1 and the second light-receiving element PD2. With this configuration, external light enters the N-type diffusion layers N.

(Switching Structure of Light-Receiving Element)

The switches SW1 to SW5 of the first light-receiving element PD1 and the second light-receiving element PD2 are switches for changing spectral sensitivity characteristics of the first light-receiving element PD1 and the second light-receiving element PD2 by changing a relation of connection between layers (a relation of connection for an anode and a cathode of each photodiode) in each of the first light-receiving element PD1 and the second light-receiving element PD2. By controlling the switches SW1 to SW5, a photocurrent can be extracted from any of the photodiodes PD_ir, PD_vis, and PD_uv.

The switch SW1 has one terminal connected to an output terminal OUT and the other terminal connected to the N-type diffusion layer N.

The switch SW2 has one terminal connected to the output terminal OUT and the one terminal of the switch SW1 and the other terminal connected to the N-type well layer N-Well.

The switch SW3 has one terminal connected to GND (ground or 0 V) and the other terminal connected to the other terminal of the switch SW1 and the N-type diffusion layer N.

The switch SW4 has one terminal connected to GND and the one terminal of the switch SW3 and the other terminal connected to the P-type well layer P-Well.

The switch SW5 has one terminal connected to the other terminal of the switch SW4 and the P-type well layer P-Well and the other terminal connected to the other terminal of the switch SW2 and the N-type well layer N-Well.

Turning of each of the switches SW1 to SW5 of the first light-receiving element PD1 and the second light-receiving element PD2 to an open position or a closed position is independently (individually) controlled by an external control portion or the like (not shown).

(Spectral Sensitivity Characteristic of Light-Receiving Element)

If effects of the UV cutoff filter 11 are ignored, the first light-receiving element PD1 and the second light-receiving element PD2 shown in FIG. 3 have the same spectral sensitivity characteristic when the first light-receiving element PD1 and the second light-receiving element PD2 are the same in an open/closed state of the switches SW1 to SW5.

The configuration and operation of a light-receiving element PD (the first light-receiving element PD1 or the second light-receiving element PD2) will be described with reference to FIGS. 4 to 7.

Figure 4:
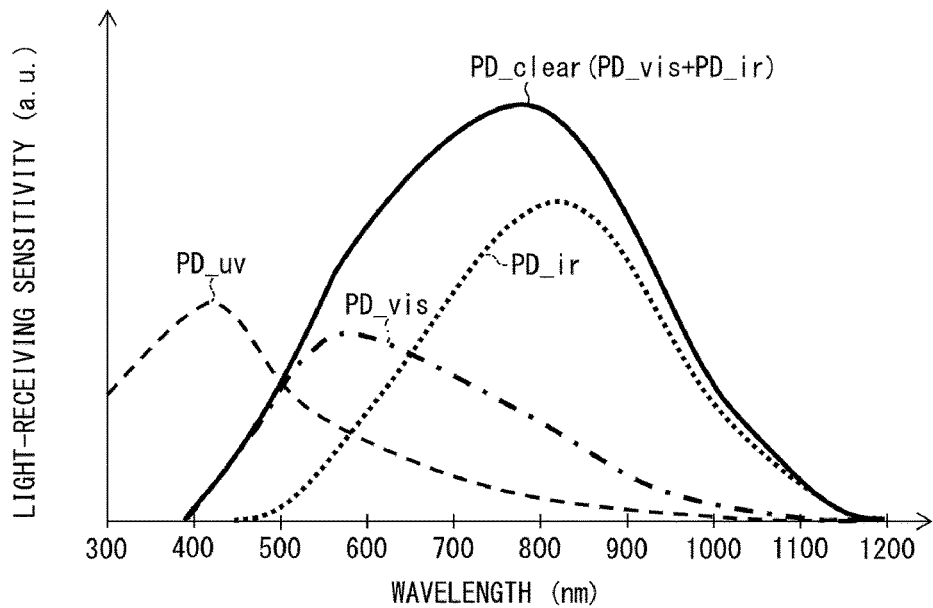
FIG. 4 is a graph showing spectral sensitivity characteristics of photodiodes of a light-receiving element.

FIG. 4 is a graph showing spectral sensitivity characteristics (PD_uv, PD_vis, PD_ir, and PD_clear=PD_vis+PD_ir) of photodiodes of the light-receiving element PD.

Figure 5:
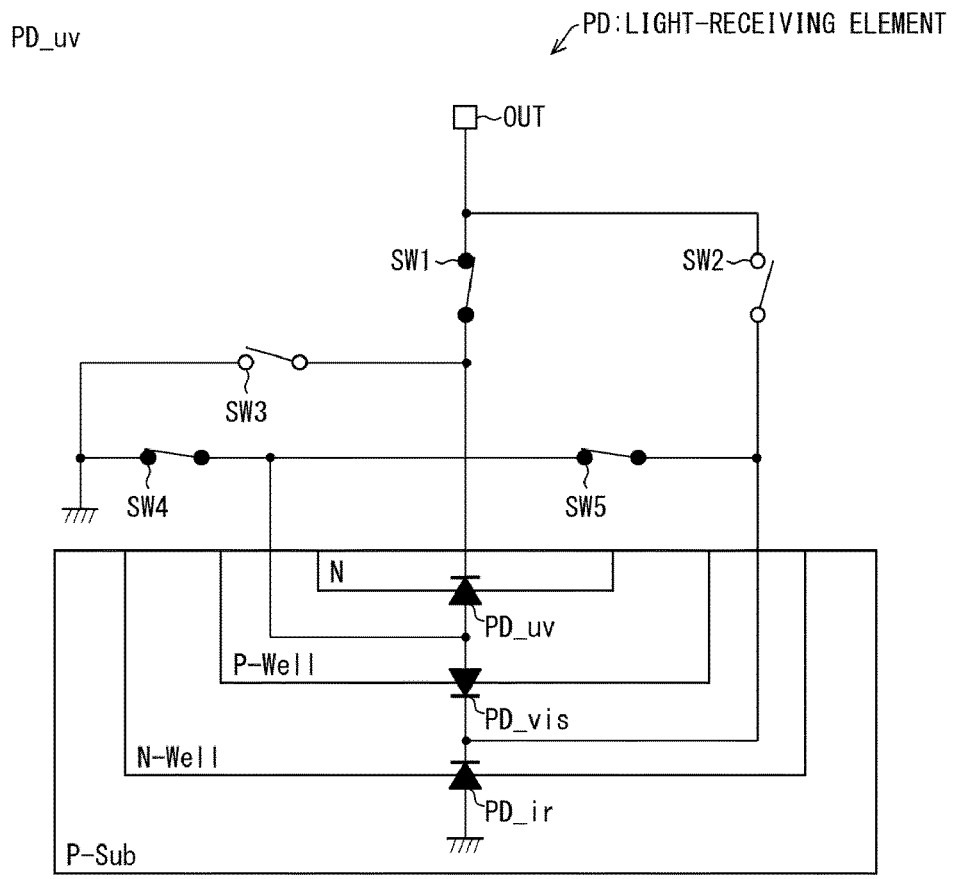
FIG. 5 is a cross-sectional view of the light-receiving element showing an open/closed state of switches when a photocurrent in a photodiode PD_uv is extracted.

FIG. 5 is a cross-sectional view of the light-receiving element PD showing an open/closed state of the switches SW1 to SW5 when a photocurrent in the photodiode PD_uv is extracted. When the switches SW1, SW4, and SW5 are turned on, and the switches SW2 and SW3 are turned off, as shown in FIG. 5, the light-receiving element PD enters a state (a first state) with sensitivity to light in an ultraviolet region. In this case, a photocurrent in the photodiode PD_uv can be extracted from the light-receiving element PD. A spectral sensitivity characteristic of the light-receiving element PD at this time is as indicated by a curve denoted by PD_uv in FIG. 4.

Figure 6:
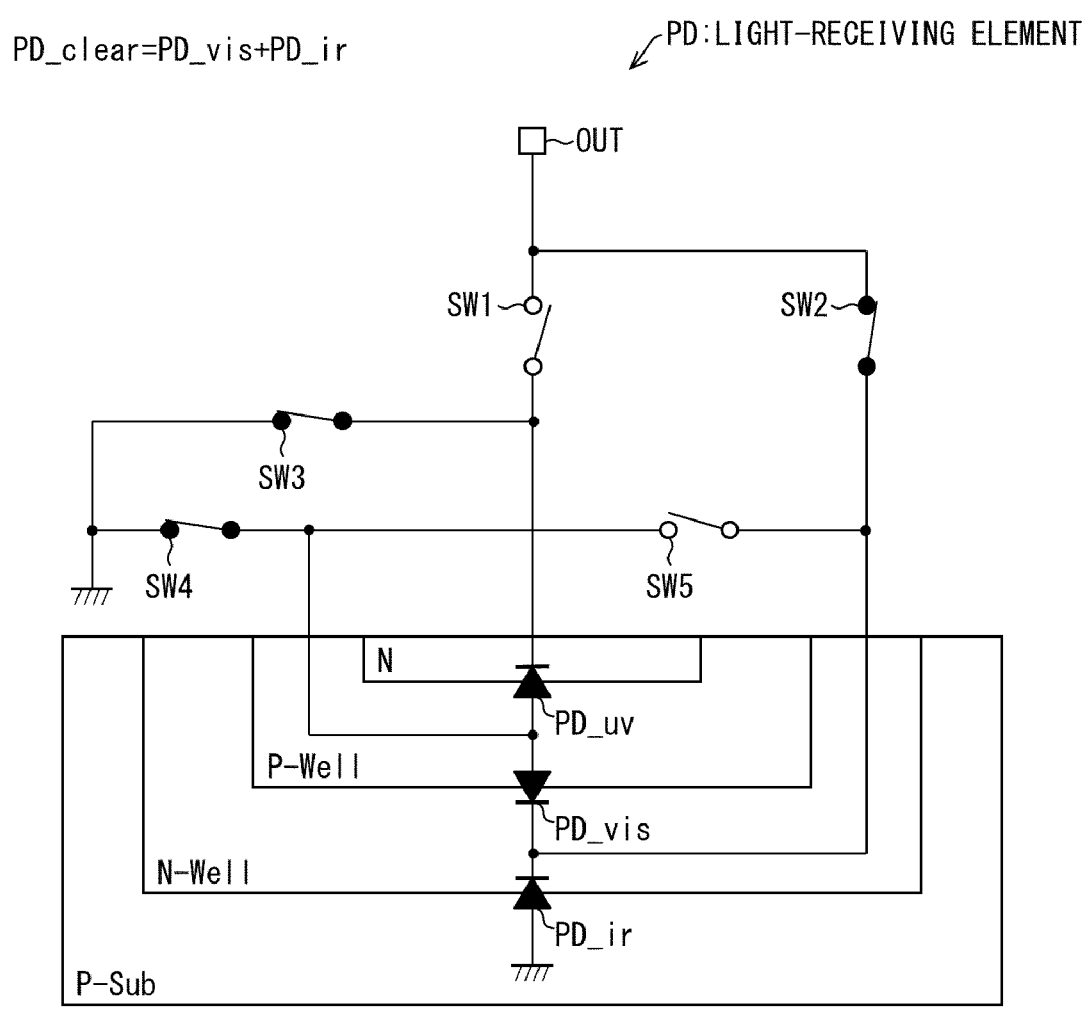
FIG. 6 is a cross-sectional view of the light-receiving element PD showing an open/closed state of the switches when a photocurrent in a photodiode PD_clear is extracted.

FIG. 6 is a cross-sectional view of the light-receiving element PD showing an open/closed state of the switches SW1 to SW5 when a photocurrent in a photodiode PD_clear which is a combination of the photodiode PD_vis and the photodiode PD_ir is extracted. When the switches SW2 to SW4 are turned on, and the switches SW1 and SW5 are turned off, as shown in FIG. 6, the light-receiving element PD enters a state (a second state) with sensitivity to light in a visible light region and light in an infrared region. In this case, a photocurrent in the photodiode PD_clear (PD_vis+PD_ir) can be extracted from the light-receiving element PD. A spectral sensitivity characteristic of the light-receiving element PD at this time is as indicated by a curve denoted by PD_clear (PD_vis+PD_ir) in FIG. 4.

Figure 7:
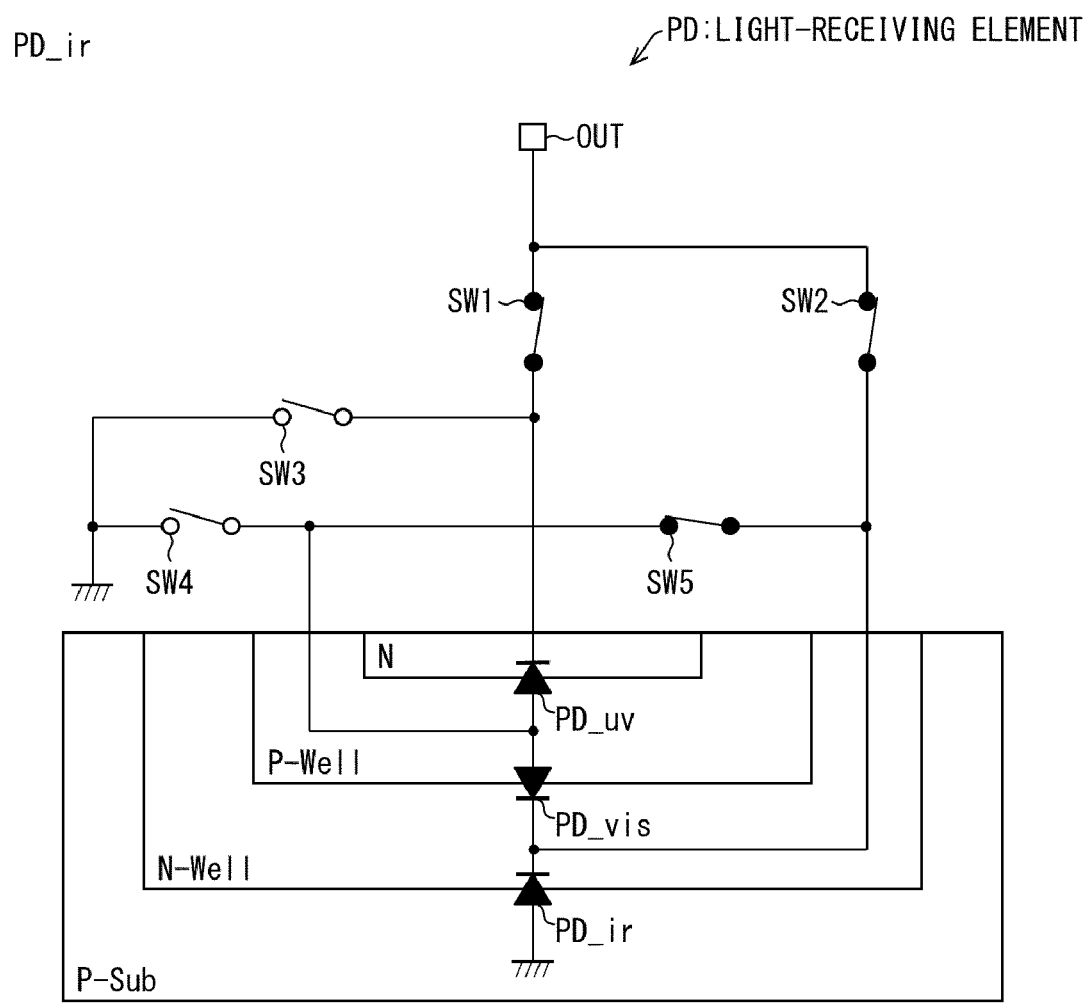
FIG. 7 is a cross-sectional view of the light-receiving element PD showing an open/closed state of the switches when a photocurrent in a photodiode PD_ir is extracted.

FIG. 7 is a cross-sectional view of the light-receiving element PD showing an open/closed state of the switches SW1 to SW5 when a photocurrent in the photodiode PD_ir is extracted. When the switches SW1, SW2, and SW5 are turned on, and the switches SW3 and SW4 are turned off, as shown in FIG. 7, the light-receiving element PD enters a state (the second state) with sensitivity to light in the infrared region. In this case, a photocurrent in the photodiode PD_ir can be extracted from the light-receiving element PD. A spectral sensitivity characteristic of the first light-receiving element PD1 at this time is as indicated by a curve denoted by PD_ir in FIG. 4.

Note that, if there is a need to extract a photocurrent in the photodiode PD_vis, the sensor circuit portion can compute a digital output value corresponding to the photocurrent extracted from the photodiode PD_vis by subtracting a digital output value obtained through conversion of the photocurrent extracted from the photodiode PD_ir from a digital output value obtained through conversion of the photocurrent extracted from the photodiode PD_vis and the photodiode PD_ir.

By controlling turning of each of the switches SW1 to SW5 of the light-receiving element PD to the open position or the closed position as described above, light intensity can be measured on the basis of respective spectral sensitivity characteristics of the three photodiodes.

Thus, the first light-receiving element PD1 and the second light-receiving element PD2 are each switchable between a state with sensitivity to light in a predetermined wavelength range and a state without spectral sensitivity to light in the predetermined wavelength range.

Note that although a case where the first light-receiving element PD1 and the second light-receiving element PD2 each have a four-layer structure with an N-type diffusion layer, a P-type well layer, an N-type well layer, and a P-type substrate has been described above, the first light-receiving element PD1 and the second light-receiving element PD2 may each have a four-layer structure with a P-type diffusion layer, an N-type well layer, a P-type well layer, and an N-type substrate.

Although a case where the first light-receiving element PD1 and the second light-receiving element PD2 have the same layer structure has been described, the first light-receiving element PD1 and the second light-receiving element PD2 may not have the same layer structure. Those skilled in the art may appropriately use a first light-receiving element and a second light-receiving element having layered structures different from each other and having the same spectral sensitivity characteristic.

<Sensor Circuit Portion>

As shown in FIG. 1, the sensor circuit portion 20 includes a first A/D converter ADC1 and a second A/D converter ADC2. The sensor circuit portion 20 also includes a computation portion (not shown).

The A/D converter ADC1 is connected to the first light-receiving element PD1, and converts the photocurrent Iin1 into a digital signal and outputs a digital output value ADCOUNT1. The digital output value ADCOUNT1 corresponds to the intensity of light incident on the first light-receiving element PD1.

The A/D converter ADC2 is connected to the second light-receiving element PD2, and converts the photocurrent Iin2 into a digital signal and outputs a digital output value ADCOUNT2. The digital output value ADCOUNT2 corresponds to the intensity of light incident on the second light-receiving element PD2.

The A/D converters ADC1 and ADC2 have the same configuration. The configuration and operation of an A/D converter ADC (ADC1 or ADC2) will be described with reference to FIGS. 8 and 9.

(Configuration of A/D Converter)

Figure 8:
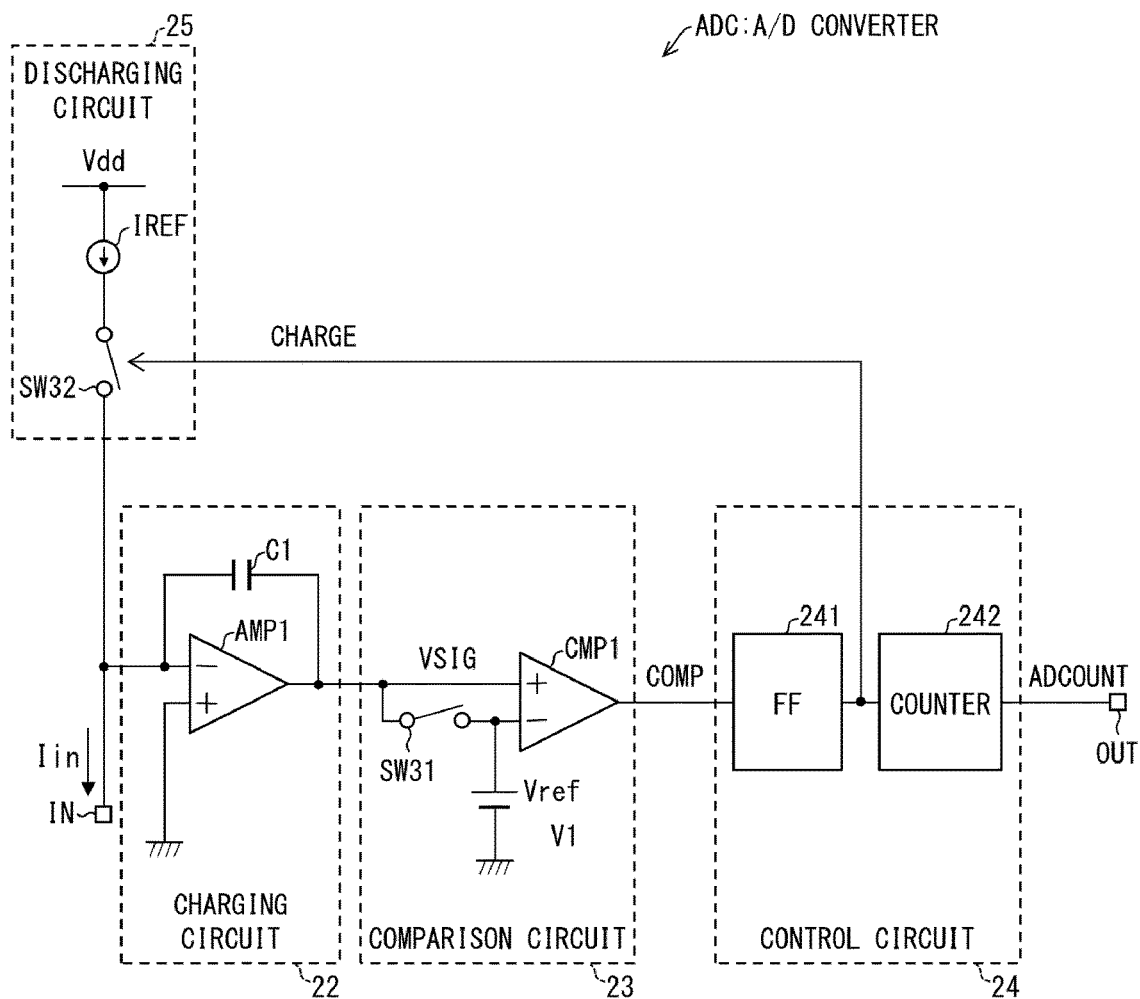
FIG. 8 is a block diagram showing the configuration of an A/D converter.

FIG. 8 is a block diagram showing the configuration of the A/D converter.

As shown in FIG. 8, the A/D converter ADC includes an input terminal IN, the output terminal OUT, a charging circuit 22, a comparison circuit 23, a control circuit 24, and a discharging circuit 25.

The charging circuit 22 is a circuit which is charged with a photocurrent Iin and is composed of an amplifier circuit AMP1 and a capacitor C1 which stores electric charge corresponding to the photocurrent Iin. The amplifier circuit AMP1 has an inverting input terminal connected to the input terminal IN, a non-inverting input terminal connected to GND, and an output terminal connected to the comparison circuit 23. The capacitor C1 is provided between the inverting input terminal of the amplifier circuit AMP1 and the output terminal. With this configuration, the amplifier circuit AMP1 and the capacitor C1 constitute an integrating circuit.

The comparison circuit 23 is a circuit which compares an output voltage from the charging circuit 22 with a reference voltage Vref and is composed of a comparator CMP1, a switch SW31, and a reference power source V1. The comparator CMP1 has a non-inverting input terminal connected to the charging circuit 22, an inverting input terminal connected to the charging circuit 22 via the switch SW31 and to the reference power source V1, and an output terminal connected to the control circuit 24. The switch SW31 is turned to an open position or a closed position (on/off) in accordance with a switching signal from the outside to establish/break electrical connection between the charging circuit 22 and the inverting input terminal of the comparator CMP1 and the reference power source V1. The reference power source V1 applies the reference voltage Vref to the inverting input terminal of the comparator CMP1.

The control circuit 24 counts the number of discharges by the discharging circuit 25 during a measurement time period on the basis of outputs (comparison results) from the comparison circuit 23 and outputs a digital output value ADCOUNT corresponding to the number, and is composed of a flip-flop (FF) 241 and a counter 242. The FF 241 has an input portion connected to the comparison circuit 23 and an output portion connected to the counter 242 and to the discharging circuit 25. An output portion of the counter 242 is connected to the output terminal OUT.

The discharging circuit 25 is intended to discharge the charging circuit 22 (cause the charging circuit 22 to discharge electric charge stored in the capacitor C1) when the output voltage from the charging circuit 22 exceeds the reference voltage Vref and is composed of a current source IREF and a switch SW32. The switch SW32 has one terminal connected to the current source IREF and the other terminal connected to the charging circuit 22 and the input terminal IN. The switch SW32 is turned to an open position or a closed position (on/off) in accordance with a switching signal (an output signal CHARGE from the FF 241) to establish/break electrical connection between the both.

(Operation of A/D Converter)

Figure 9:
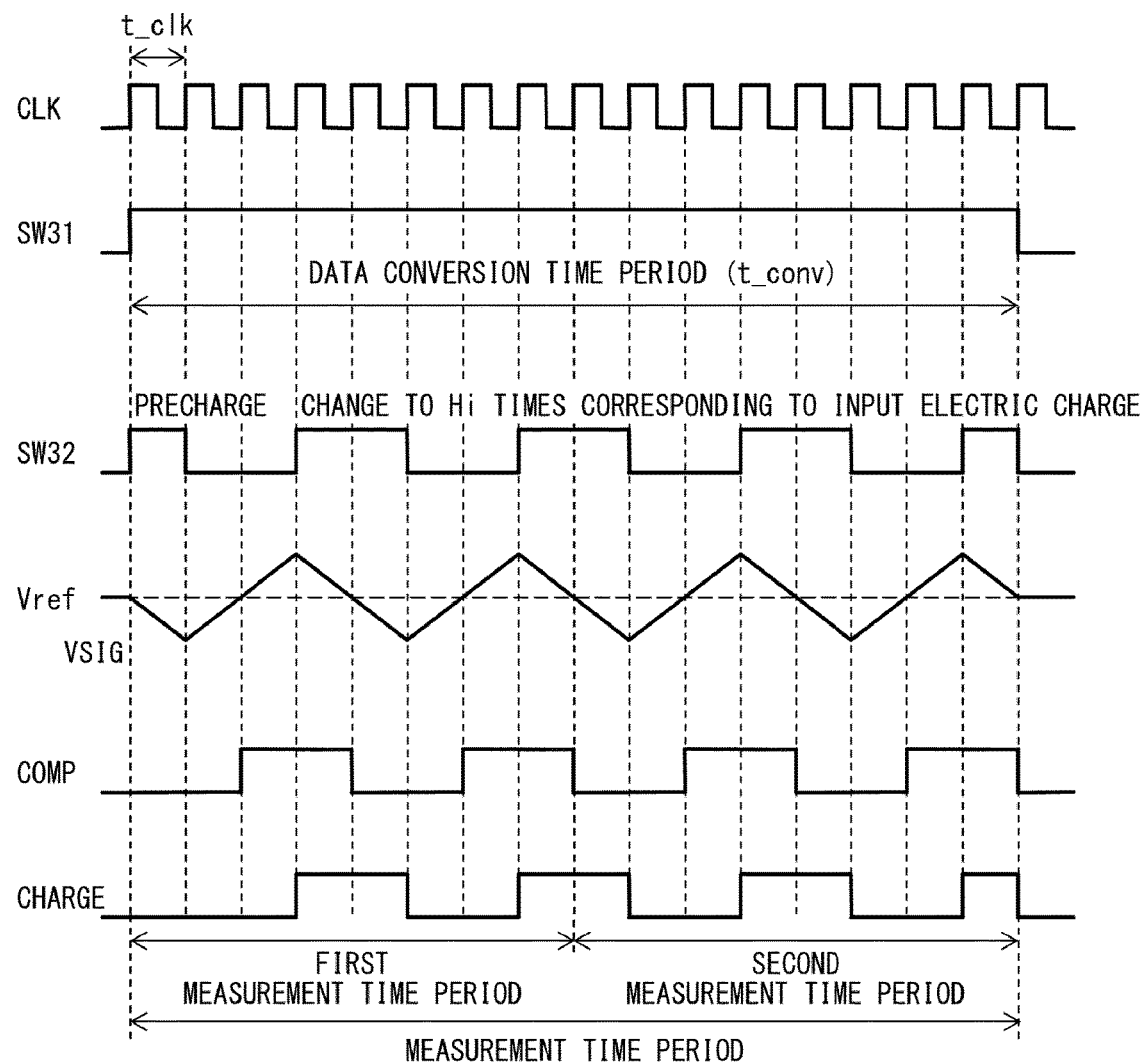
FIG. 9 is a timing diagram showing an example of operation of the A/D converter.

FIG. 9 is a timing diagram showing an example of operation of the A/D converter ADC shown in FIG. 8. In FIG. 9, CLK denotes a clock signal, SW31 denotes an open/closed state of the switch SW31, SW32 denotes an open/closed state of the switch SW32, Vref denotes a voltage of the reference power source V1 indicated by a broken line, VSIG denotes an output from the charging circuit 22 indicated by a solid line, COMP denotes an output from the comparison circuit 23, and CHARGE denotes an output from the control circuit 24 (an output from the FF 241) used to turn the switch SW32 to the open position or the closed position.

Before the start of conversion operation, the switch SW31 is at the closed position. For this reason, the output VSIG from the charging circuit 22 (the integrating circuit) is charged to the voltage Vref of the reference power source V1.

When the switch SW31 is turned to the open position, the A/D converter ADC is enabled to charge the capacitor C1 with the photocurrent Iin and performs AD conversion operation. An open period for the switch SW31 is a data conversion period (a charging period, t_conv) and corresponds to a measurement time period.

During the data conversion period, the switch SW32 is first turned to the closed position to cause the discharging circuit 25 to discharge fixed electric charge (IREF×t_clk) from the capacitor C1 (precharge operation). The switch SW32 is then turned to the open position, the charging circuit 22 is charged with the photocurrent Iin from the light-receiving element PD, and the output VSIG from the charging circuit 22 rises. When the output VSIG exceeds the voltage Vref, the output COMP from the comparison circuit 23 switches from low voltage to high voltage. With this switching, the output from the FF 241, that is, the output CHARGE from the control circuit 24 switches from low voltage to high voltage, the switch SW32 is turned on, and the fixed electric charge (IREF×t_clk) is discharged by the discharging circuit 25.

With the discharge, the output VSIG from the charging circuit 22 then drops. When the output VSIG drops below the voltage Vref, the output COMP from the comparison circuit 23 switches from high voltage to low voltage. With this switching, the output from the FF 241, that is, the output CHARGE from the control circuit 24 switches from high voltage to low voltage, and the switch SW32 is turned off to stop the discharge.

After that, the charging circuit 22 is charged again with the photocurrent Iin from the light-receiving element PD, and operation is performed in the same manner as described above.

Meanwhile, during the data conversion period (t_conv), the counter 242 counts the number of time periods when the output from the FF 241 is at high voltage, that is, discharge time periods, and a count value of the counter 242 is digitally output as a value corresponding to the amount of input electric charge. The output from the counter 242 serves as the output ADCOUNT from the A/D converter ADC.

The A/D converter ADC operates such that the amount of electric charge charged with the photocurrent Iin is equal to the amount of electric charge discharged by (IREF×t_clk). Since the amount of charged electric charge (Iin×t_conv)= the amount of discharged electric charge (IREF×t_clk× count), (Expression 1) below holds.

$$\text{count} = (\text{Iin} \times t\_\text{conv})/(\text{IREF} \times t\_\text{clk}) \qquad (1)$$

count: a value obtained by counting discharge time periods
Iin: an input current value
IREF: a reference current value
t_conv: a charging time period
t_clk: a clock period It is thus apparent that minimum resolution of a value (count) obtained by counting discharge time periods is determined by (IREF×t_clk).

<Principle of Ultraviolet Measurement>

The principle of detecting ultraviolet intensity in the light receiver 1 shown in FIG. 1 will next be described.

Figure 10:
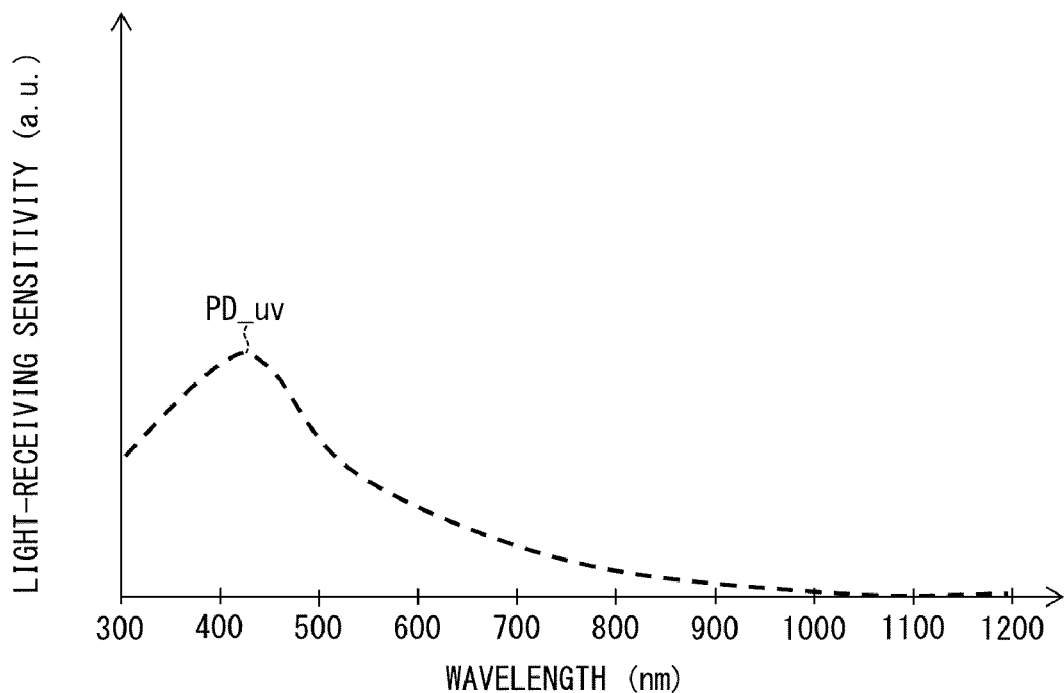
FIG. 10 is a graph showing a spectral sensitivity characteristic of the photodiode PD_uv.

FIG. 10 is a graph showing the spectral sensitivity characteristic of the photodiode PD_uv. As shown in FIG. 10, a peak wavelength in the spectral sensitivity characteristic of the photodiode PD_uv is about 450 nm. More specifically, the peak wavelength in the spectral sensitivity characteristic of the photodiode PD_uv is a wavelength of 420 to 430 nm. Note that such a peak wavelength can be adjusted by adjusting the junction depth of a PN junction in a light-receiving element.

Figure 11:
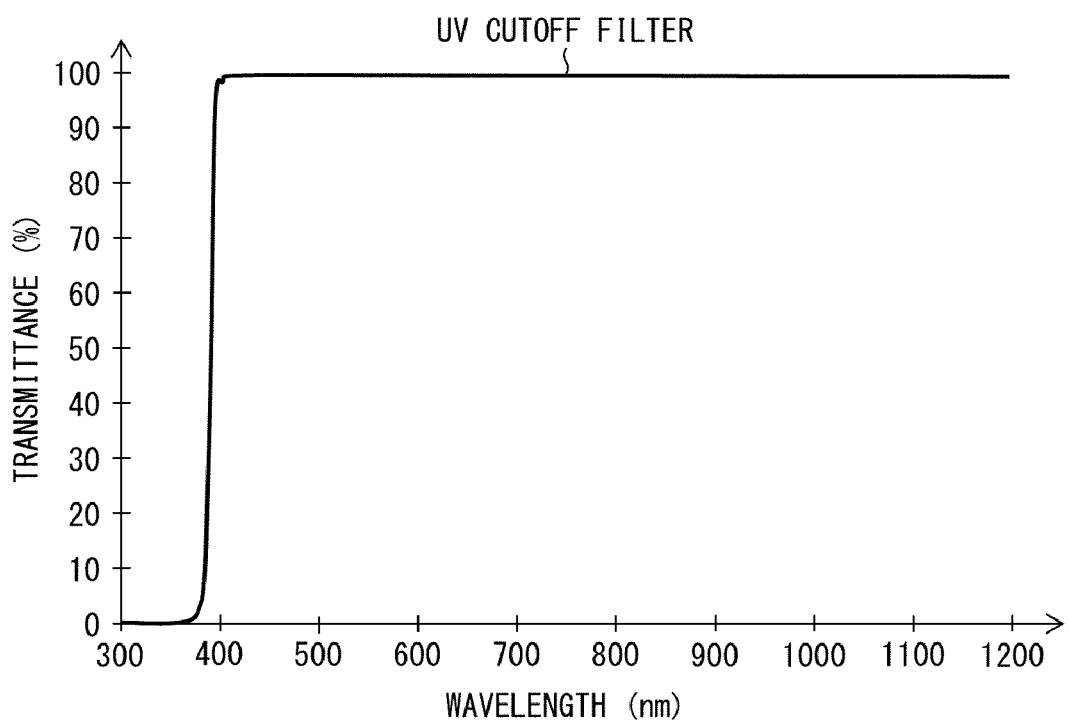
FIG. 11 is a graph showing a spectral transmittance characteristic of a UV cutoff filter.

FIG. 11 is a graph showing a spectral sensitivity characteristic of the UV cutoff filter 11 shown in FIG. 3. In the UV cutoff filter 11, the transmittance of light having a wavelength not more than 400 nm is low, and the transmittance of light having a wavelength not less than 400 nm is almost 100%.

Figure 12:
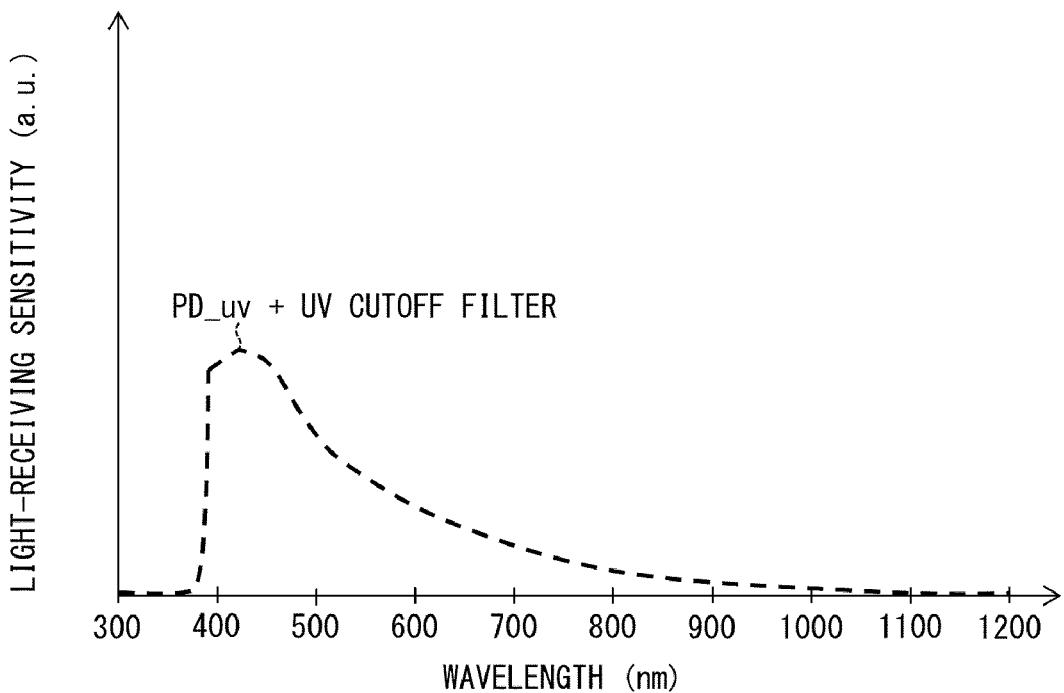
FIG. 12 is a graph showing a spectral sensitivity characteristic of the photodiode PD_uv for light after passage through the UV cutoff filter.

FIG. 12 is a graph showing a spectral sensitivity characteristic of the photodiode PD_uv for light after passage through the UV cutoff filter 11.

In the sensor circuit portion 20 of the light receiver 1 shown in FIG. 1, the digital output values ADCOUNT1 and ADCOUNT2 are output.

The computation portion (not shown) computes a difference between the digital output value ADCOUNT2 and the digital output value ADCOUNT1. The difference is obtained by subtracting the intensity of light incident on the first light-receiving element PD1 from the intensity of light incident on the second light-receiving element PD2.

Figure 13:
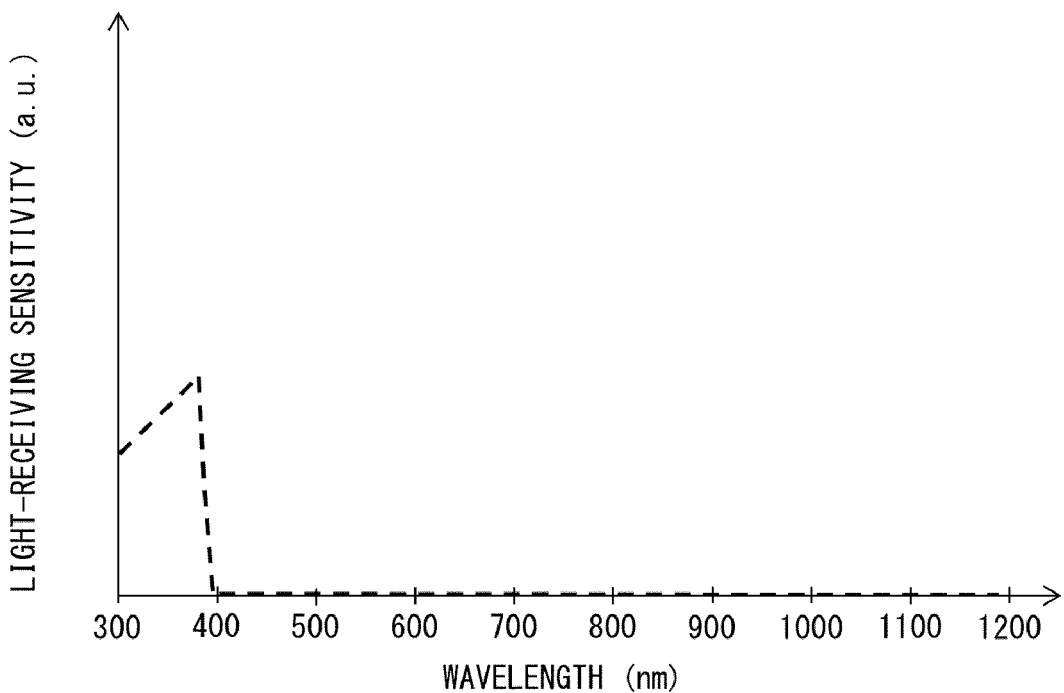
FIG. 13 is a graph showing a spectral sensitivity characteristic in the entire light receiver according to the first embodiment.

For this reason, if an open/closed state of the switches SW1 to SW5 is as in FIG. 5 both in the first light-receiving element PD1 and in the second light-receiving element PD2, a spectral sensitivity characteristic in the entire light-receiving portion 10 can be considered to be a spectral sensitivity characteristic shown in FIG. 13.

Since the light-receiving portion 10 has sensitivity only to the ultraviolet region covering wavelengths not more than 400 nm, the light receiver 1 can accurately measure ultraviolet intensity.

<Measurement and Correction>

The light receiver 1 shown in FIG. 1 performs corrective measurement before ultraviolet measurement that detects ultraviolet intensity on the above-described principle. The computation portion (not shown) computes a value of unevenness in radiated light (incident light) entering the light-receiving portion 10. After the ultraviolet measurement, the computation portion corrects the ultraviolet measurement using the value of unevenness.

(Corrective Measurement)

(PD_vis+PD_ir)

Figure 14:
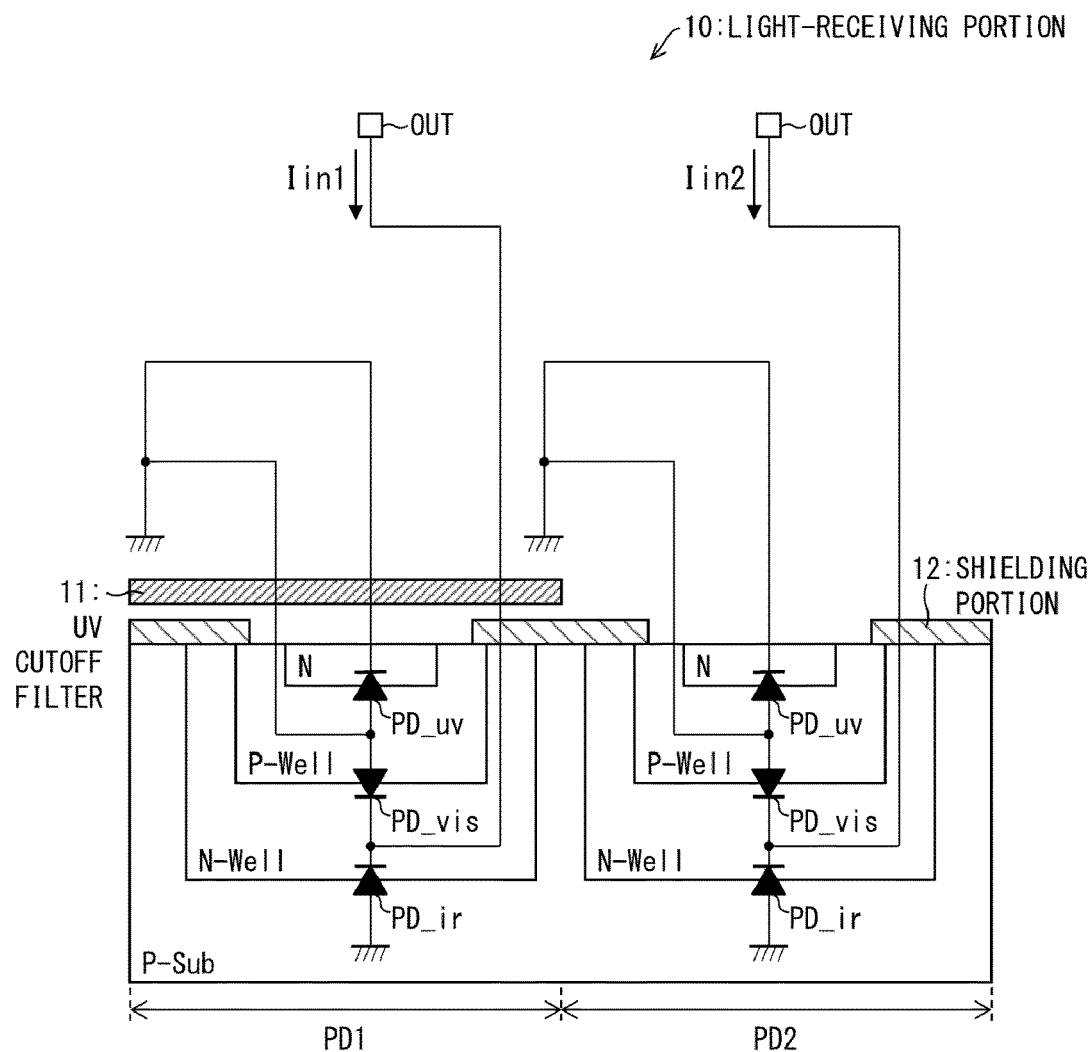
FIG. 14 is a cross-sectional view of the light-receiving portion at the time of corrective measurement.

FIG. 14 is a cross-sectional view of the light-receiving portion 10 when the light receiver 1 performs corrective measurement. Since an open/closed state of the switches SW1 to SW5 of the first photodiode PD1 and an open/closed state of the switches SW1 to SW5 of the second photodiode PD2 are both the open/closed state shown in FIG. 6, a photocurrent is extracted from the photodiode PD_clear (PD_vis+PD_ir) both in the first photodiode PD1 and in the second photodiode PD2.

As shown in FIG. 2, the first photodiode PD1 and the second photodiode PD2 are arranged adjacent to each other. As shown in FIG. 4, the spectral sensitivity characteristic of the photodiode PD_clear extends over almost the whole of a region covering wavelengths not less than 400 nm. As shown in FIG. 11, the spectral transmittance of the UV cutoff filter 11 provided above the first photodiode PD1 is almost 100% in the region covering wavelengths not less than 400 nm.

Thus, in a connection state shown in FIG. 14 of the first photodiode PD1 and the second photodiode PD2, unevenness in radiated light entering the first photodiode PD1 and the second photodiode PD2 can be measured.

(Value of Unevenness in Radiated Light)

Let ADC1_clear and ADC2_clear be the respective digital output values ADCOUNT1 and ADCOUNT2 shown in FIG. 1 when the first photodiode PD1 and the second photodiode PD2 are in the connection state shown in FIG. 14. Letting Bias' and Bias2 be respective values of unevenness in radiated light to the first light-receiving element PD1 and radiated light to the second light-receiving element PD2, (Expression 2) and (Expression 3) below hold.

$$Bias1=2\times ADC1\_clear/(ADC1\_clear+ADC2\_clear) \quad (2)$$

$$Bias2=2\times ADC2\_clear/(ADC1\_clear+ADC2\_clear) \quad (3)$$

Generally, as for unevenness in radiated light from a single light source, there is a correlation between different wavelength ranges. Thus, although a wavelength range to be measured in the corrective measurement is different from a wavelength range to be measured in the ultraviolet measurement, the values Bias1 and Bias2 of unevenness in radiated light computed through the corrective measurement can be used to correct ultraviolet intensity to be detected by the ultraviolet measurement.

Sunlight as a light source serving as a main measurement object in the ultraviolet measurement has a broad spectral characteristic extending from the ultraviolet region to the infrared region. Thus, unevenness in radiated light can be measured in the visible light region and/or the infrared region. Additionally, use of the photodiode PD_clear (PD_vis+PD_ir) having a broad spectral sensitivity characteristic over the visible light region and the infrared region in the corrective measurement allows achievement of high light-receiving sensitivity and improvement in the precision of the values Bias1 and Bias2 of unevenness in radiated light.

The sum of an output value when the first light-receiving element PD1 with the UV cutoff filter 11 is connected and an output value when the second light-receiving element PD2 without the UV cutoff filter 11 is connected is used as the denominator of Bias1 in (Expression 2) above and the denominator of Bias2 in (Expression 3) above. Since the sum is equivalent to an output value when light is received by the first light-receiving element PD1 and the second light-receiving element PD2 in their entirety, unevenness in incident light on the first light-receiving element PD1 and the second light-receiving element PD2, variation in sensitivity between the first light-receiving element PD1 and the second light-receiving element PD2, and effects of the UV cutoff filter 11 can be averaged and dispersed.

(Ultraviolet Measurement)

The light receiver 1 performs the ultraviolet measurement that detects ultraviolet intensity. At this time, the switches SW1 to SW5 of the first light-receiving element PD1 and the switches SW1 to SW5 of the second light-receiving element PD2 are both in the open/closed state shown in FIG. 5. Let ADC1_uv and ADC2_uv be the respective digital output values ADCOUNT1 and ADCOUNT2 shown in FIG. 1 at the time of the ultraviolet measurement.

(Correction of Ultraviolet Measurement)

The computation portion (not shown) corrects the ultraviolet measurement by multiplying the digital output values ADC1_uv and ADC2_uv by reciprocals of the values Bias1 and Bias2 of unevenness in radiated light. Letting ADC1_uv_correct and ADC2_uv_correct be respective digital values obtained by correcting the digital output values ADC1_uv and ADC2_uv, (Expression 4) and (Expression 5) below hold.

$$ADC1\_uv\_correct = ADC1\_uv/Bias1 \quad (4)$$

$$ADC2\_uv\_correct = ADC2\_uv/Bias2 \quad (5)$$

The computation portion (not shown) computes high-precision ultraviolet intensity after correction of unevenness in radiated light by (Expression 6) below.

$$ADC2\_uv\_correct - ADC1\_uv\_correct \quad (6)$$

Since the light-receiving portion 10 has sensitivity only to the ultraviolet region covering wavelengths not more than 400 nm and the computation portion corrects ultraviolet intensity, the light receiver 1 can accurately measure ultraviolet intensity.

<Illuminance Measurement>

The light receiver 1 shown in FIG. 1 can also perform illuminance measurement that measures the illuminance of visible light.

For example, an open/closed state of the switches SW1 to SW5 of the first light-receiving element PD1 is set as in FIG. 7, and a photocurrent is extracted from the photodiode PD_ir of the first light-receiving element PD1 and is input to the A/D converter ADC1. At the same time, an open/closed state of the switches SW1 to SW5 of the second light-receiving element PD2 is set as in FIG. 6, and a photocurrent is extracted from the photodiode PD_clear of the second light-receiving element PD2 and is input to the A/D converter ADC2.

The photodiode PD_clear has a spectral sensitivity characteristic for the visible light region and the infrared region, and the photodiode PD_ir has a spectral sensitivity characteristic for the infrared region. For this reason, the computation portion can compute the illuminance of visible light from a difference between the digital output values ADCOUNT1 and ADCOUNT2.

Note that, as for the illuminance measurement, more accurate illuminance measurement can be performed by performing correction similar to the correction of the ultraviolet measurement described above using the values Bias1 and Bias2 of unevenness in radiated light.

<First Modification>

A modification of the present embodiment will be described with reference to FIGS. 15 to 17 as follows.

Figure 15:
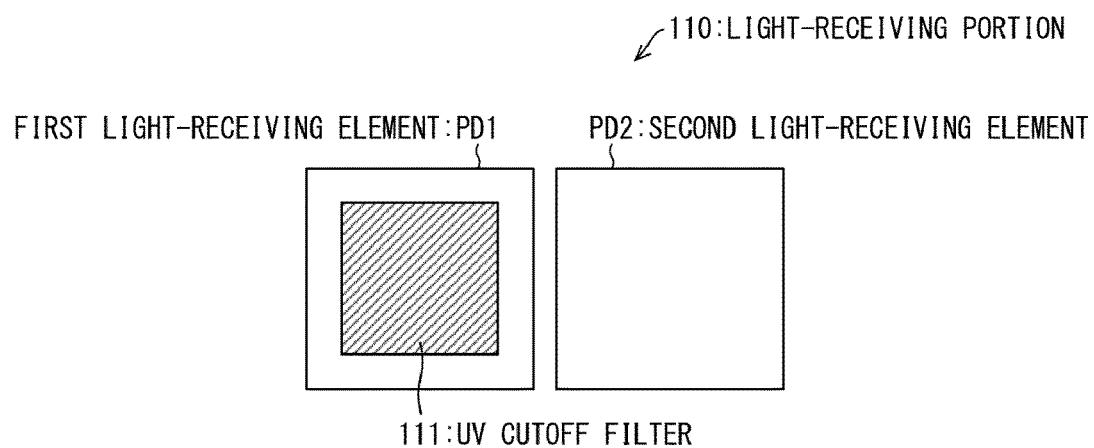
FIG. 15 is a plan view of a light-receiving portion according to a first modification.

FIG. 15 is a plan view of a light-receiving portion 110 according to the present modification. The light receiver 1 shown in FIG. 1 may include the light-receiving portion 110 instead of the light-receiving portion 10. Like the light receiver 1, a light receiver including the light-receiving portion 110 performs corrective measurement, computation of a value of unevenness in radiated light entering the light-receiving portion 110, ultraviolet measurement, correction of the ultraviolet measurement, and illuminance measurement.

As shown in FIG. 15, the light-receiving portion 110 includes the first light-receiving element PD1 and the second light-receiving element PD2 that are arranged adjacent to each other in plan view. A UV cutoff filter 111 is provided above a part of the first light-receiving element PD1.

The UV cutoff filter 111 is identical to the UV cutoff filter 11 shown in FIGS. 2 and 3 in the transmittance of light in a wavelength range for ultraviolet rays, the transmittance of light outside the wavelength range for ultraviolet rays, material, and the like but is different in arrangement above the first light-receiving element PD1.

More specifically, the UV cutoff filter 111 is provided above the first light-receiving element PD1 so as to cover a part of the N-type diffusion layer N. Light after passage through the UV cutoff filter 111 enters a region where the UV cutoff filter 111 is present above the N-type diffusion layer N, and incident light directly enters a region where the UV cutoff filter 111 is absent above the N-type diffusion layer N.

Figure 16:
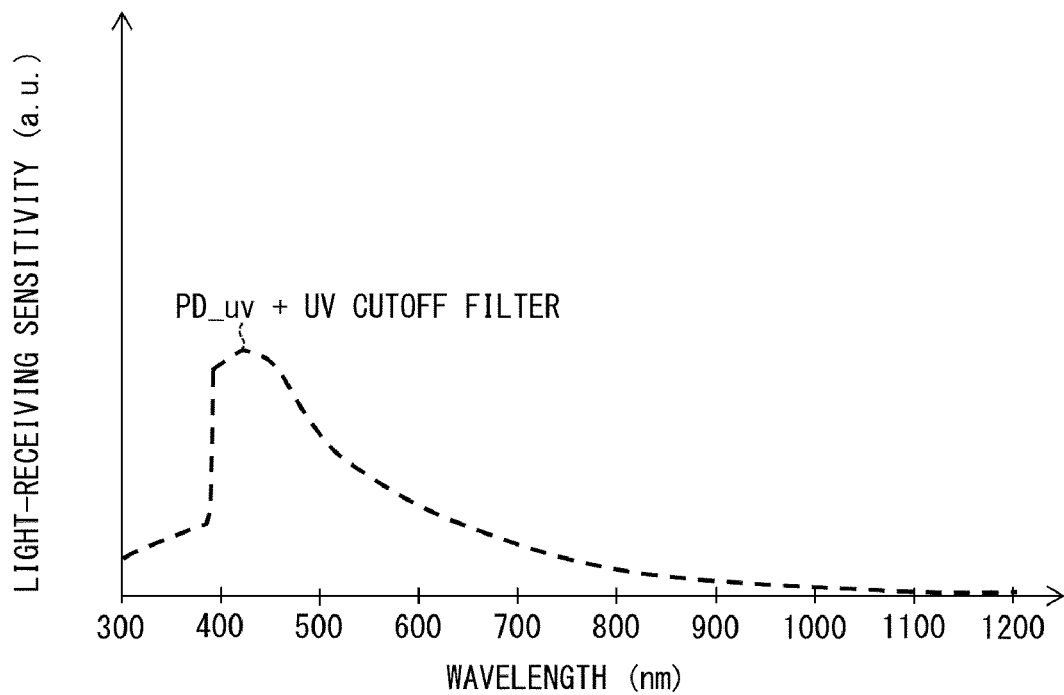
FIG. 16 is a graph showing a spectral sensitivity characteristic of the photodiode PD_uv for light after passage through a UV cutoff filter according to the first modification and light without passage through the UV cutoff filter.

FIG. 16 is a graph showing a spectral sensitivity characteristic of the photodiode PD_uv for light after passage through the UV cutoff filter according to the present modification and light without passage through the UV cutoff filter.

In the light-receiving portion 110, the UV cutoff filter 111 is provided above the first light-receiving element PD1 so as to cover a part of the N-type diffusion layer N. For this reason, a spectral sensitivity characteristic of the first light-receiving element PD1 in a connection state shown in FIG. 5 is the spectral sensitivity characteristic shown in FIG. 16.

Meanwhile, since the UV cutoff filter 111 is not provided above the second light-receiving element PD2, a spectral sensitivity characteristic of the second light-receiving element PD2 in the connection state shown in FIG. 5 is a spectral sensitivity characteristic shown in FIG. 10.

Figure 17:
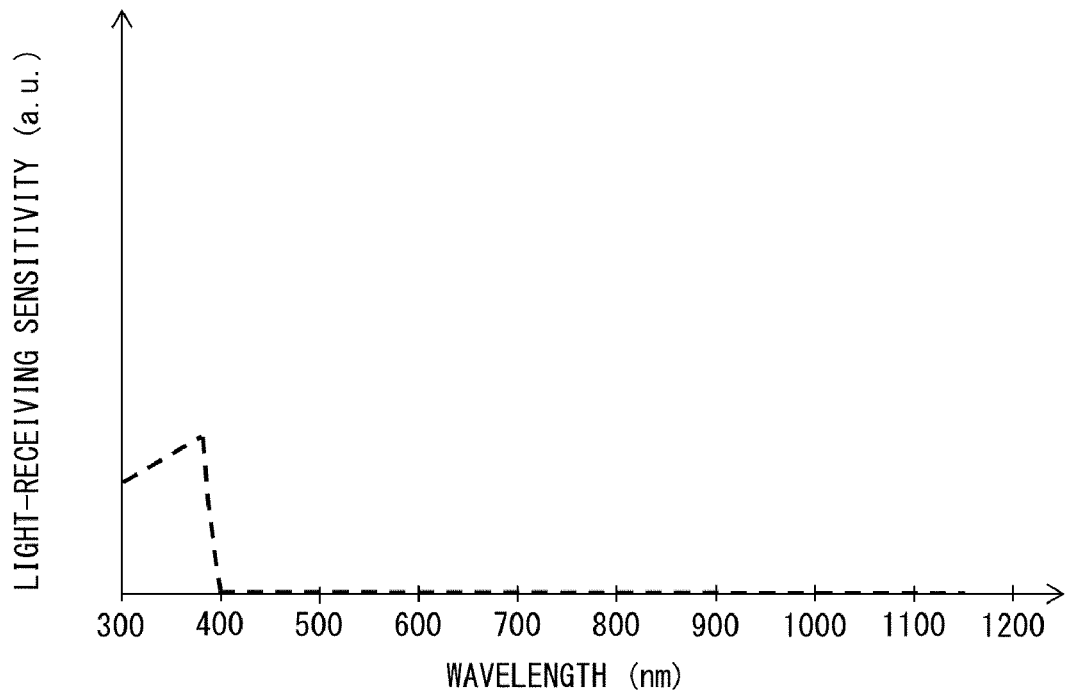
FIG. 17 is a graph showing a spectral sensitivity characteristic in the entire light receiver according to the first modification.

For this reason, if an open/closed state of the switches SW1 to SW5 is as in FIG. 5 both in the first light-receiving element PD1 and in the second light-receiving element PD2, a spectral sensitivity characteristic in the entire light-receiving portion 110 can be considered to be a spectral sensitivity characteristic shown in FIG. 17.

According to the light-receiving portion 110 of the present modification, the UV cutoff filter 111 may not cover the entire upper surface of the first light-receiving element PD1. It is thus possible to increase the degree of flexibility in the design of the light-receiving portion 110 and the light receiver including the light-receiving portion 110.

<Second Modification>

Another modification of the present embodiment will be described with reference to FIG. 18 as follows.

Figure 18:
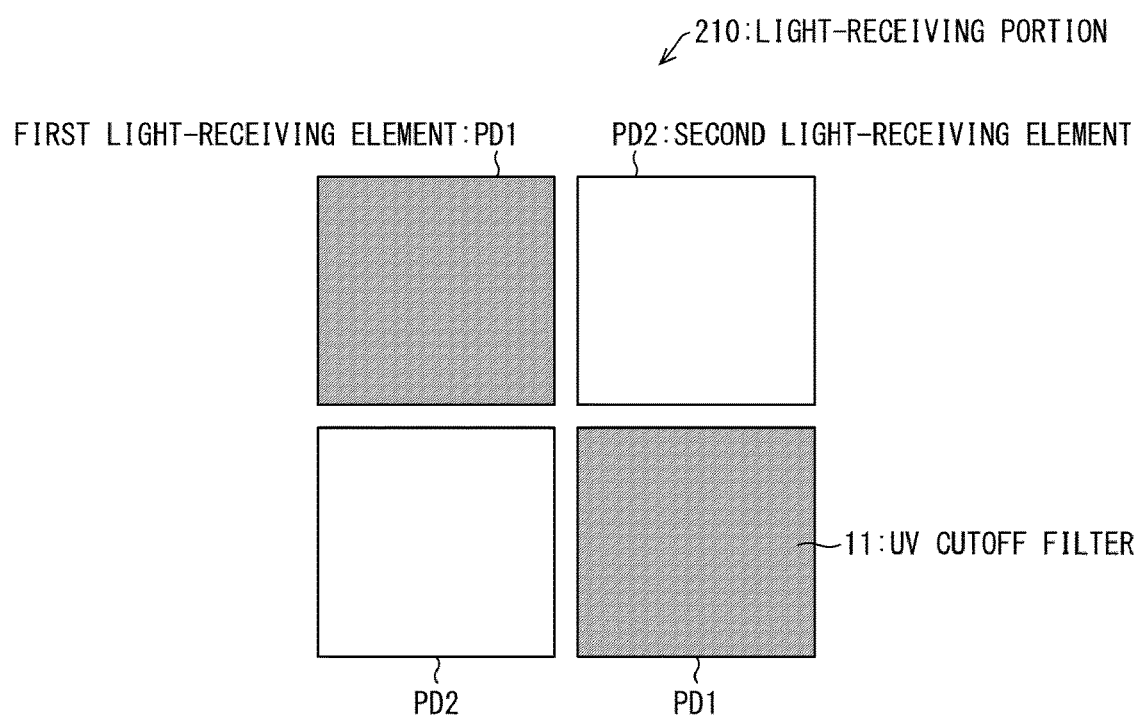
FIG. 18 is a plan view of a light-receiving portion according to a second modification.

FIG. 18 is a plan view of a light-receiving portion 210 according to the present modification. The light receiver 1 shown in FIG. 1 may include the light-receiving portion 210 instead of the light-receiving portion 10. Like the light receiver 1, a light receiver including the light-receiving portion 210 performs corrective measurement, computation of a value of unevenness in radiated light entering the light-receiving portion 210, ultraviolet measurement, correction of the ultraviolet measurement, and illuminance measurement.

As shown in FIG. 18, the light-receiving portion 210 includes two first light-receiving elements PD1 and two second light-receiving elements PD2. The first light-receiving elements PD1 and the second light-receiving elements PD2 are both diagonally arranged like one quadrangle divided into quarters along a cross.

Since the first light-receiving elements PD1 and the second light-receiving elements PD2 are both diagonally arranged in the light-receiving portion 210 according to the present modification, unevenness in incident radiated light and variation in sensitivity between light-receiving elements can be reduced. For this reason, the light receiver including the light-receiving portion 210 can perform higher-precision corrective measurement, ultraviolet measurement, and illuminance measurement.

Note that the present embodiment has been described in the context of a case where corrective measurement is performed in a state in which the UV cutoff filter 11 is provided above the first light-receiving element PD1 and the first light-receiving element PD1 and the second light-receiving element PD2 have sensitivity to the visible light region and the infrared region. As long as corrective measurement can be performed in a state in which the first light-receiving element PD1 and the second light-receiving element PD2 have sensitivity to light in a wavelength range which is not cut off (blocked) by an optical filter provided above the first light-receiving element PD1, the type of the optical filter provided above the first light-receiving element PD1 and states and spectral sensitivity characteristics of the first light-receiving element PD1 and the second light-receiving element PD2 are not limited to the above-described ones.

Although the present embodiment has also been described in the context of a case where the first light-receiving element PD1 and the second light-receiving element PD2 each have three PN junctions (the three photodiodes PD_uv, PD_vis, and PD_ir), the present invention is not limited to this. The first light-receiving element PD1 and the second light-receiving element PD2 may each include two or more PN junctions (two or more photodiodes) such that corrective measurement and measurement reflecting the values Bias' and Bias2 of unevenness in radiated light can be performed.

Second Embodiment

Another embodiment of the present invention will be described with reference to FIG. 19 as follows. Note that, for convenience of illustration, members having the same functions as those described in the above-described embodiment are denoted by the same reference characters, and a description of the members will be omitted.

<Correction>

A light receiver 1 shown in FIG. 1 can perform corrective measurement, using a wavelength range different from that for the corrective measurement described in the first embodiment.

(Corrective Measurement)
(PD_ir)

Figure 19:
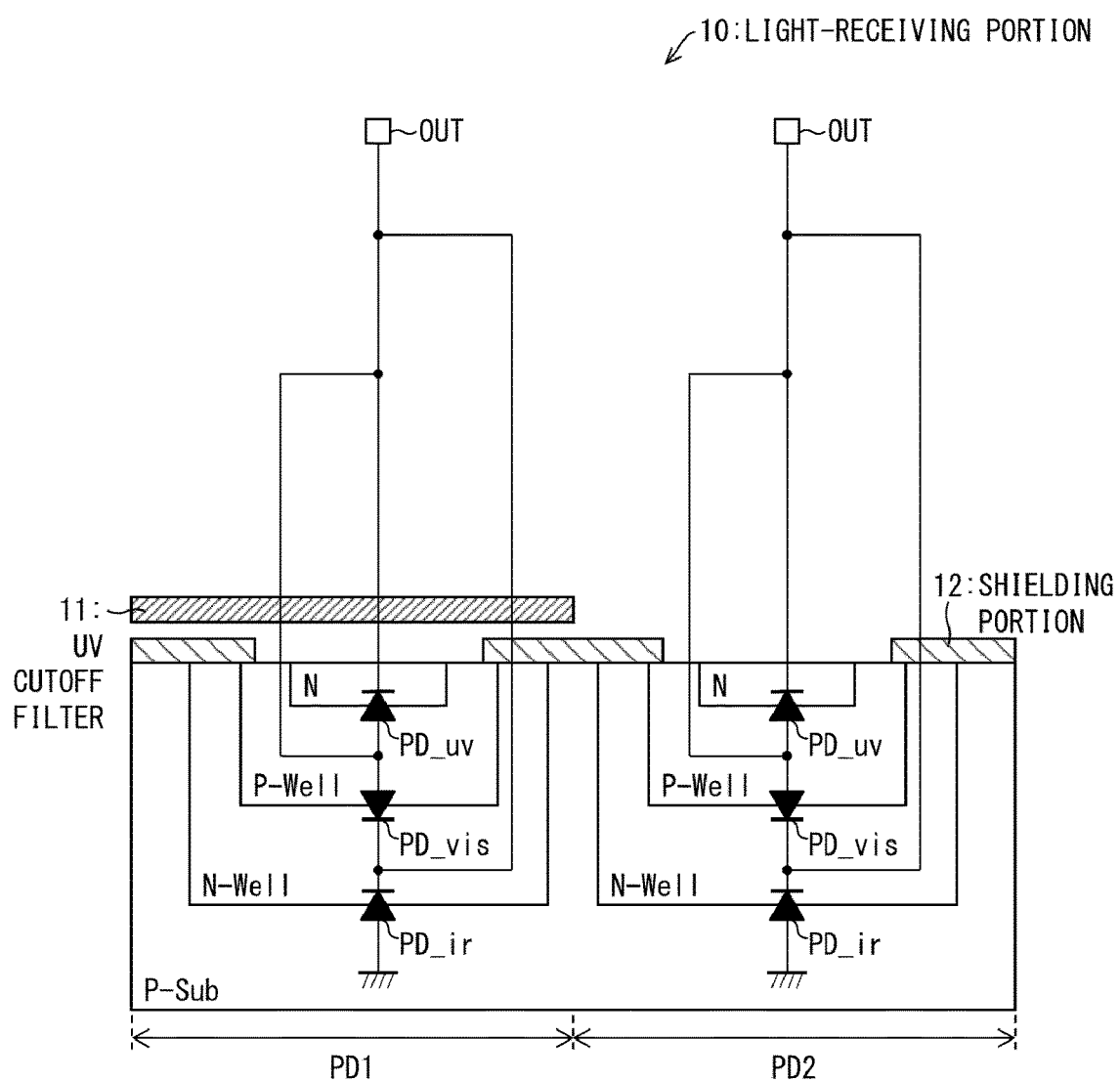
FIG. 19 is a cross-sectional view of a light-receiving portion at the time of different corrective measurement.

FIG. 19 is a cross-sectional view of a light-receiving portion 10 when a light receiver 1 shown in FIG. 1 performs corrective measurement using a different wavelength range. Since an open/closed state of switches SW1 to SW5 of a first photodiode PD1 and an open/closed state of the switches SW1 to SW5 of a second photodiode PD2 are both an open/closed state shown in FIG. 7, the first photodiode PD1 and the second photodiode PD2 both extract a photocurrent from a photodiode PD_ir.

As shown in FIG. 2, the first photodiode PD1 and the second photodiode PD2 are arranged adjacent to each other. As shown in FIG. 4, a spectral sensitivity characteristic of the photodiode PD_ir extends over almost the whole of a region covering wavelengths not less than 400 nm. As shown in FIG. 11, the spectral transmittance of a UV cutoff filter 11 provided above the first photodiode PD1 is almost 100% in the region covering wavelengths not less than 400 nm.

Thus, in a connection state shown in FIG. 19 of the first photodiode PD1 and the second photodiode PD2, unevenness in radiated light entering the first photodiode PD1 and the second photodiode PD2 can be measured.

(Value of Unevenness in Radiated Light)

Let ADC1_ir and ADC2_ir be respective digital output values ADCOUNT1 and ADCOUNT2 shown in FIG. 1 when the first photodiode PD1 and the second photodiode PD2 are in the connection state shown in FIG. 19. Letting Bias1 and Bias2 be respective values of unevenness in radiated light to the first light-receiving element PD1 and the second light-receiving element PD2, (Expression 7) and (Expression 8) below hold.

$$Bias1 = 2 \times ADC1\_ir/(ADC1\_ir + ADC2\_ir) \qquad (7)$$

$$Bias2 = 2 \times ADC2\_ir/(ADC1\_ir + ADC2\_ir) \qquad (8)$$

Like the first embodiment, the light receiver 1 performs ultraviolet measurement and correction of the ultraviolet measurement. Since the light-receiving portion 10 has sensitivity only to an ultraviolet region covering wavelengths not more than 400 nm and a computation portion corrects ultraviolet intensity, the light receiver 1 can accurately measure ultraviolet intensity.

Third Embodiment

Another embodiment of the present invention will be described with reference to FIGS. 20 to 23 as follows. Note that, for convenience of illustration, members having the same functions as those described in the above-described embodiments are denoted by the same reference characters, and a description of the members will be omitted.

Figure 20:
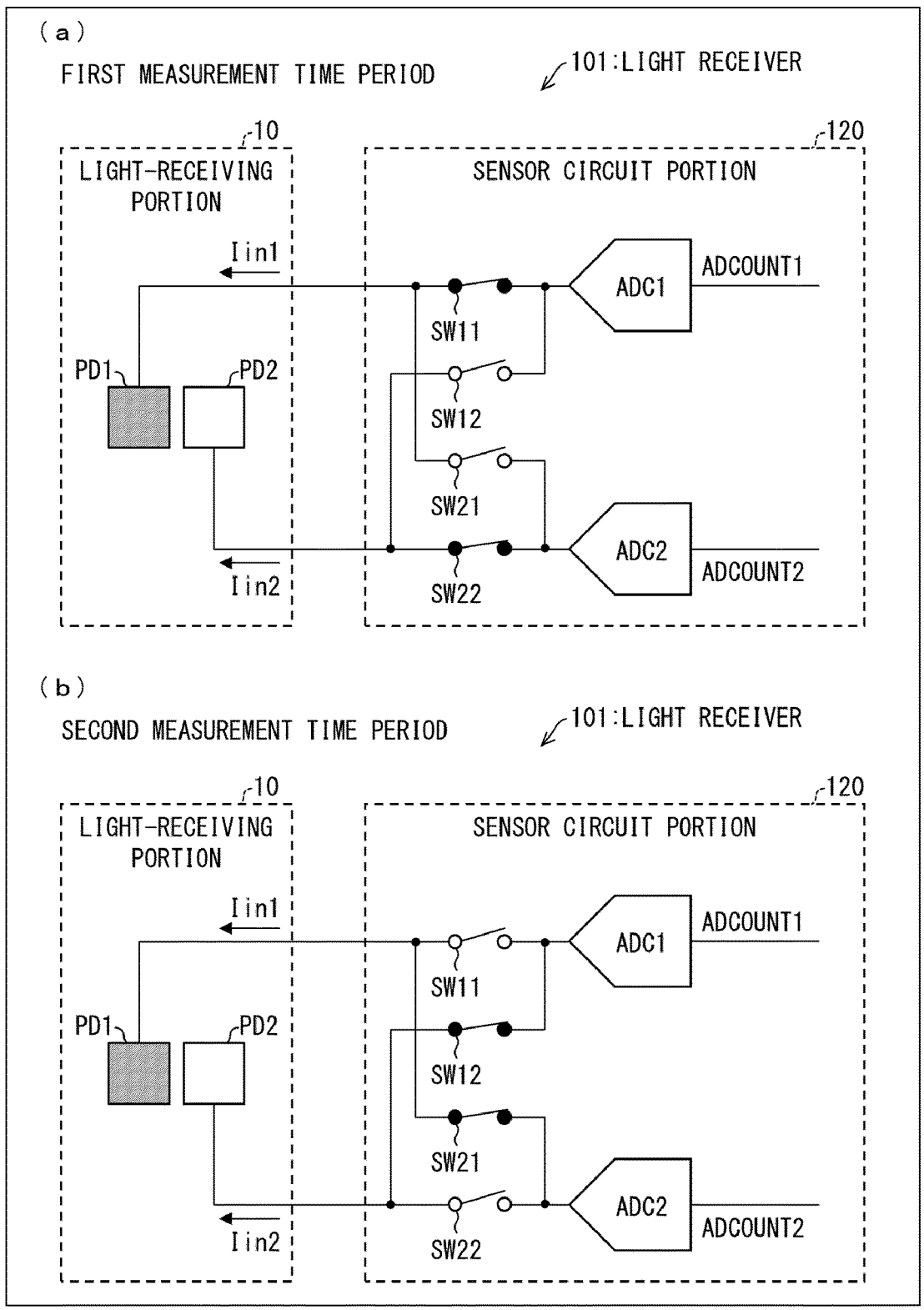
FIG. 20 is block diagrams showing configurations of a light receiver according to a third embodiment, FIG. 20(*a*) shows a first open/closed state of switches, and FIG. 20(*b*) shows a second open/closed state of the switches.

FIG. 20 is block diagrams showing configurations of a light receiver 101 according to the present embodiment. FIG. 20(a) shows a first open/closed state of switches SW11, SW12, SW21, and SW22 while FIG. 20(b) shows a second open/closed state of the switches SW11, SW12, SW21, and SW22.

As shown in FIG. 20, the light receiver 101 according to the present embodiment includes a light-receiving portion 10 and a sensor circuit portion 120 which detects the intensity of light on the basis of a photocurrent.

The sensor circuit portion 120 includes four switches SW (SW11, SW12, SW21, and SW22). With this configuration, connection between a first light-receiving element PD1 and a second light-receiving element PD2 and an A/D converter ADC1 and an A/D converter ADC2 can be switched. The sensor circuit portion 120 also includes a computation portion (not shown).

For example, in a state in which the switches SW11 and SW22 are on and the switches SW12 and SW21 are off, like the first open/closed state shown in FIG. 20(a), the first light-receiving element PD1 and the second light-receiving element PD2 are respectively connected to the A/D converters ADC1 and ADC2. In a state in which the switches SW12 and SW21 are on and the switches SW11 and SW22 are off, like the second open/closed state shown in FIG. 20(b), the first light-receiving element PD1 and the second light-receiving element PD2 are respectively connected to the A/D converters ADC2 and ADC1.

<Measurement and Correction>

The light receiver 101 can perform corrective measurement by a method different from that for the corrective measurement described in the first embodiment and correction of ultraviolet measurement.

The corrective measurement is divided into first corrective measurement and second corrective measurement, and a measurement time period for the first corrective measurement is divided into a first measurement time period and a second measurement time period, as shown in FIG. 9.

(First Corrective Measurement)
(Denominator)

Figure 21:
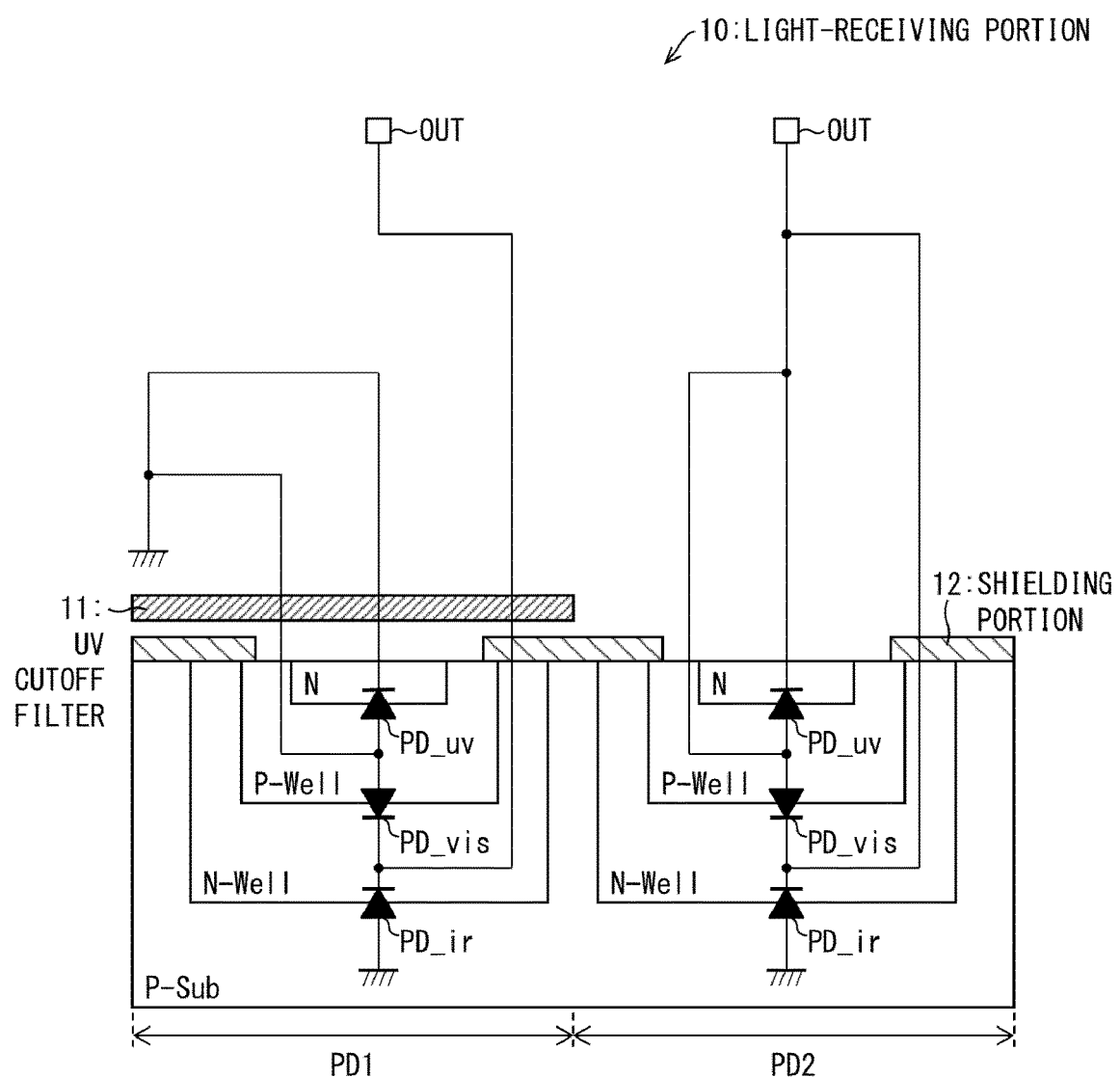
FIG. 21 is a cross-sectional view of a light-receiving portion during a first measurement time period for first corrective measurement.

FIG. 21 is a cross-sectional view of the light-receiving portion 10 when the light receiver 101 is during the first measurement time period (a first period) for the first corrective measurement. An open/closed state of switches SW1 to SW5 of the first photodiode PD1 is an open/closed state shown in FIG. 6, and an open/closed state of the switches SW1 to SW5 of the second photodiode PD2 is an open/closed state shown in FIG. 7. At the same time, the switches SW11, SW12, SW21, and SW22 of the sensor circuit portion 120 are in the first open/closed state shown in FIG. 20(a).

Thus, a photocurrent is extracted from a photodiode PD_clear of the first light-receiving element PD1 and is input to the A/D converter ADC1. Let ADC1_part1_clear1 and ADC2_part1_ir2 be the numbers of discharge time periods counted by the A/D converters ADC1 and ADC2, respectively, during the first measurement time period when a photocurrent is extracted from a photodiode PD_ir of the second light-receiving element PD2 and is input to the A/D converter ADC2.

Figure 22:
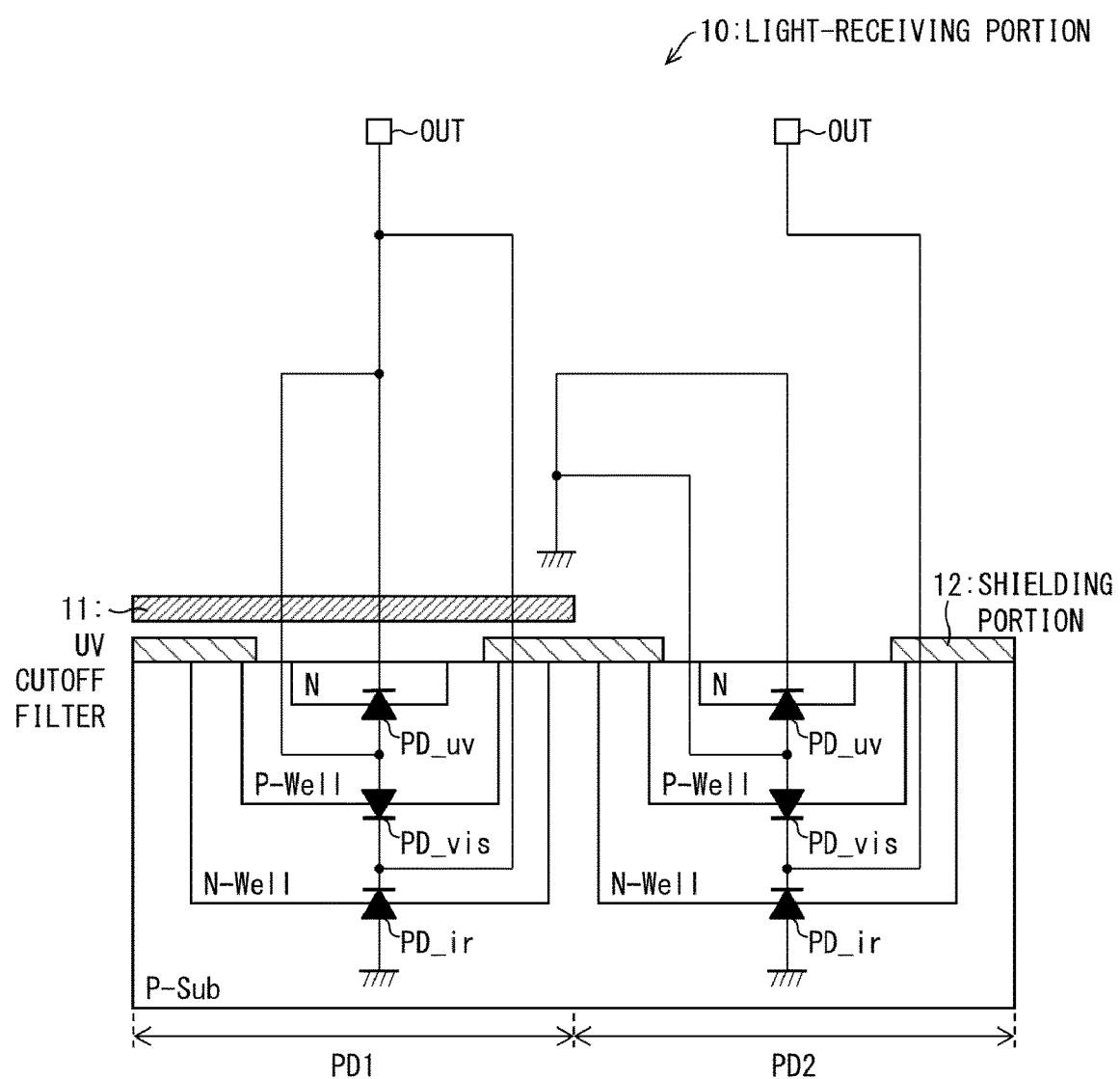
FIG. 22 is a cross-sectional view of the light-receiving portion during a second measurement time period for the first corrective measurement.

FIG. 22 is a cross-sectional view of the light-receiving portion 10 when the light receiver 101 is during the second measurement time period (a second period) for the first corrective measurement. An open/closed state of the switches SW1 to SW5 of the first photodiode PD1 is the open/closed state shown in FIG. 7, and an open/closed state of the switches SW1 to SW5 of the second photodiode PD2 is the open/closed state shown in FIG. 6. At the same time, the switches SW11, SW12, SW21, and SW22 of the sensor circuit portion 120 are in the second open/closed state shown in FIG. 20(b).

Thus, a photocurrent is extracted from the photodiode PD_ir of the first light-receiving element PD1 and is input to the A/D converter ADC2. A photocurrent is extracted from the photodiode PD_clear of the second light-receiving element PD2 and is input to the A/D converter ADC1. Let ADC1_part2_clear2 and ADC2_part2_ir1 be the numbers of discharge time periods counted by the A/D converters ADC1 and ADC2, respectively, during the second measurement time period.

Letting ADC1_1st_clear and ADC2_1st_ir be respective digital output values ADCOUNT1 and ADCOUNT2 from the A/D converters ADC1 and ADC2 in the first corrective measurement, (Expression 9) and (Expression 10) below hold.

$$ADC1\_1st\_clear = ADC1\_part1\_clear1 + ADC1\_part2\_clear2 \quad (9)$$

$$ADC2\_1st\_ir = ADC2\_part1\_ir2 + ADC2\_part2\_ir1 \quad (10)$$

Since the first light-receiving element PD1 and the second light-receiving element PD2 are differently connected to the A/D converters ADC1 and ADC2 in the first measurement time period and in the second measurement time period, ADC1_1st_clear and ADC2_1st_ir use both the first light-receiving element PD1 and the second light-receiving element PD2. For this reason, if the first measurement time period and the second measurement time period are the same, ADC1_1st_clear and ADC2_1st_ir are each equivalent to a value half an output value when light is received by the first light-receiving element PD1 and the second light-receiving element PD2 in their entirety in the first corrective measurement.

Thus, unevenness in radiated light to the first light-receiving element PD1 and the second light-receiving element PD2 and variation in sensitivity between the first light-receiving element PD1 and the second light-receiving element PD2 for a visible light region and an infrared region can be averaged and dispersed. Additionally, the first light-receiving element PD1 is covered with a UV cutoff filter 11, and effects of the UV cutoff filter 11 can be averaged and dispersed. As a result, effects of differences between the first light-receiving element PD1 and the second light-receiving element PD2, including the presence or absence of the UV cutoff filter 11, can be reduced.

In addition, the computation portion can compute the illuminance of visible light by ADC1_1st_clear-ADC2_1st_ir. ADC1_1st_clear represents the intensity of radiated light in the visible light and infrared regions while ADC2_1st_ir represents the intensity of radiated light in the infrared region. Thus, the light receiver 101 can measure the intensity of radiated light in the visible light region and/or the infrared region with high precision in the first corrective measurement. Note that the order of the first measurement time period and the second measurement time period may be changed.

(Second Corrective Measurement)
(Numerator)

When the light receiver 101 performs the second corrective measurement (a third period), the sensor circuit portion 120 is in the first open/closed state shown in FIG. 20(a), and the light-receiving portion 10 is in a connection state shown in FIG. 21.

Thus, a photocurrent is extracted from the photodiode PD_clear of the first light-receiving element PD1 and is input to the A/D converter ADC1. A photocurrent is extracted from the photodiode PD_ir of the second light-receiving element PD2 and is input to the A/D converter ADC2.

Let ADC1_2nd_clear1 and ADC2_2nd_ir2 be the respective digital output values ADCOUNT1 and ADCOUNT2 from the A/D converters ADC1 and ADC2 in the second corrective measurement.

(Value of Unevenness in Radiated Light)

Letting Bias1 and Bias2 be respective values of unevenness in radiated light to the first light-receiving element PD1 and the second light-receiving element PD2, (Expression 11) and (Expression 12) below hold.

$$Bias1 = ADC1\_2nd\_clear1 / ADC1\_1st\_clear \quad (11)$$

$$Bias2 = ADC2\_2nd\_ir2 / ADC2\_1st\_ir \quad (12)$$

Note that a time period which is the sum of the first measurement time period and the second measurement time period in the first corrective measurement in the present embodiment is equal to a measurement time period in the second corrective measurement.

The present invention is not limited to the above, and the time period that is the sum of the first measurement time period and the second measurement time period in the first corrective measurement may be different from the measurement time period in the second corrective measurement. If the sum is different, the values Bias1 and Bias2 of unevenness in radiated light are corrected by multiplying (Expression 11) and (Expression 12) above by a ratio of the first measurement time period and the second measurement time period.

(Ultraviolet Measurement)

When the light receiver 101 performs ultraviolet measurement, the sensor circuit portion 120 is in the first open/closed state shown in FIG. 20(a), and the switches SW1 to SW5 of the first photodiode PD1 and the switches SW1 to SW5 of the second photodiode PD2 of the light-receiving portion 10 are both in an open/closed state shown in FIG. 5. Let ADC1_uv and ADC2_uv be the respective digital output values ADCOUNT1 and ADCOUNT2 shown in FIG. 1 at the time of the ultraviolet measurement.

(Correction of Ultraviolet Measurement)

Like the first embodiment, the computation portion (not shown) corrects the ultraviolet measurement by multiplying the digital output values ADC1_uv and ADC2_uv by reciprocals of the values Bias1 and Bias2 of unevenness in radiated light. The computation portion (not shown) computes high-precision ultraviolet intensity after correction of unevenness in radiated light.

Since the light-receiving portion 10 has sensitivity only to an ultraviolet region covering wavelengths not more than 400 nm and the computation portion corrects ultraviolet intensity, the light-receiving portion 10 can accurately measure ultraviolet intensity.

<Third Modification>

A modification of the present embodiment will be described as follows.

In the present modification, when the light receiver 101 shown in FIG. 20 performs second corrective measurement, the light receiver 101 uses the same wavelength range to compute values of unevenness in radiated light entering the first light-receiving element PD1 and the second light-receiving element PD2.

(Second Corrective Measurement)
(Numerator)

For example, when the light receiver 101 performs the second corrective measurement, the sensor circuit portion 120 is in a first open/closed state shown in FIG. 20(a), and the switches SW1 to SW5 of the first photodiode PD1 and the switches SW1 to SW5 of the second photodiode PD2 of the light-receiving portion 10 are both in an open/closed state shown in FIG. 6.

Thus, photocurrents are extracted from the photodiodes PD_clear of the first light-receiving element PD1 and the second light-receiving element PD2 and are input to the A/D converters ADC1 and ADC2.

Let ADC1_2nd_clear1 and ADC2_2nd_clear2 be the respective digital output values ADCOUNT1 and ADCOUNT2 from the A/D converters ADC1 and ADC2 at the time of the second corrective measurement.

(Value of Unevenness in Radiated Light)

Letting Bias1 and Bias2 be respective values of unevenness in radiated light to the first light-receiving element PD1 and the second light-receiving element PD2, (Expression 13) and (Expression 14) below hold.

$$Bias1 = ADC1\_2nd\_clear1/ADC1\_1st\_clear \quad (13)$$

$$Bias2 = ADC2\_2nd\_clear2/ADC1\_1st\_clear \quad (14)$$

Since the light receiver 101 according to the present modification uses a broad wavelength range in the second corrective measurement, the light receiver 101 can perform higher-precision corrective measurement and ultraviolet measurement.

<Fourth Modification>

A modification of the present embodiment will be described with reference to FIG. 23 as follows.

Figure 23:
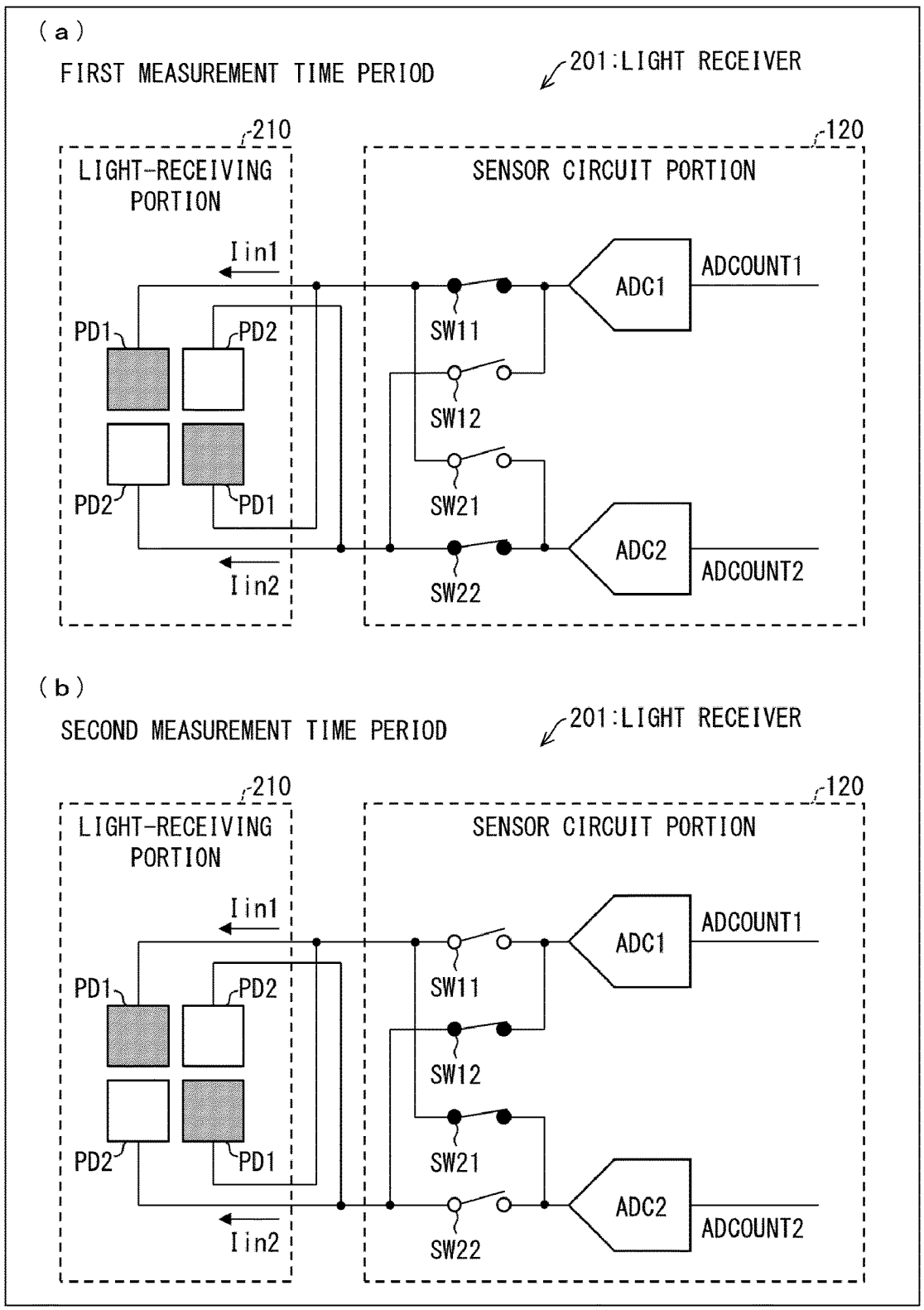
FIG. 23 is block diagrams showing configurations of a light receiver according to a third modification.
Figure 24:
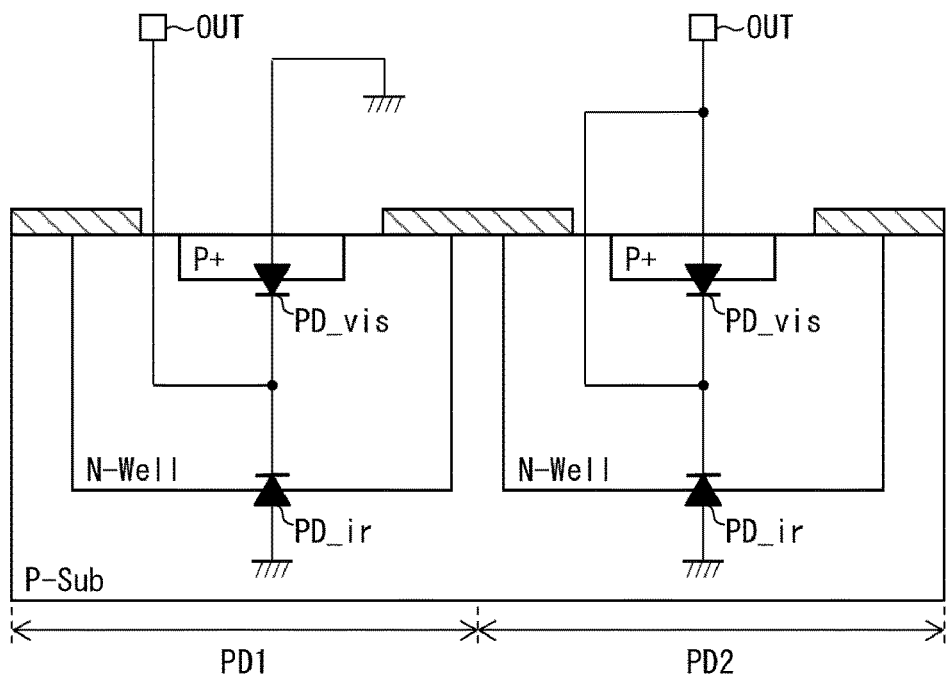
FIG. 24 is a cross-sectional view of a conventional illuminance sensor.
Figure 25:
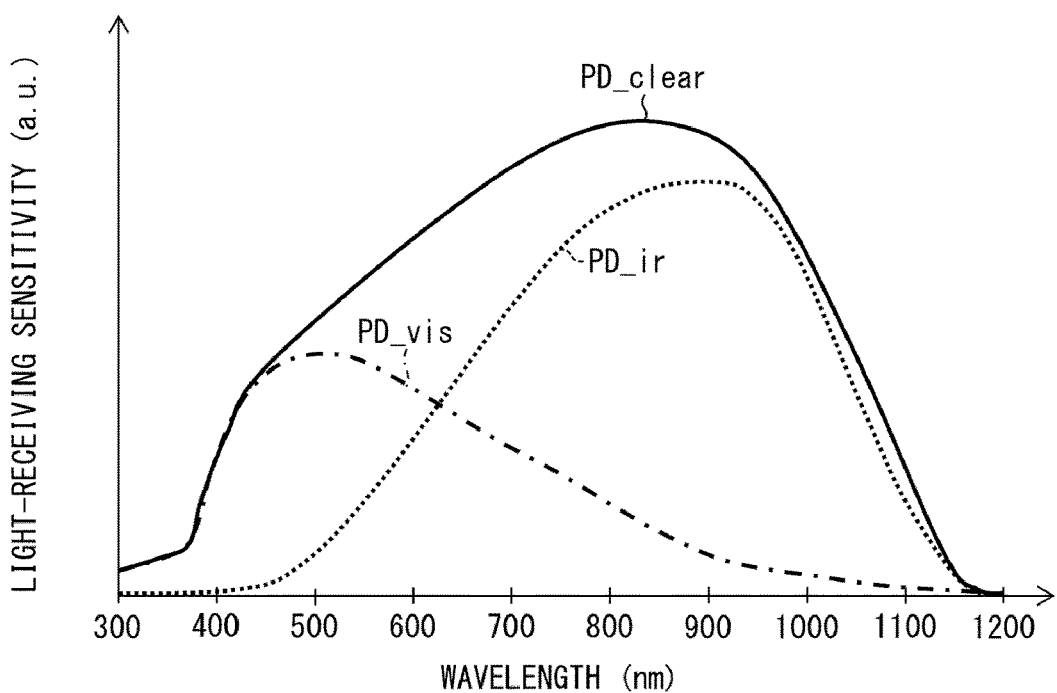
FIG. 25 is a graph showing spectral sensitivity characteristics of the conventional illuminance sensor.

FIG. 23 is block diagrams of a light receiver 201 according to the present modification. FIG. 23(a) shows a first open/closed state of the switches SW11, SW12, SW21, and SW22 while FIG. 23(b) shows a second open/closed state of the switches SW11, SW12, SW21, and SW22.

As shown in FIG. 23, the light receiver 201 according to the present modification includes a light-receiving portion 210 and the sensor circuit portion 120. Like the light receiver 1 shown in FIG. 1, the light receiver 201 performs corrective measurement, computation of a value of unevenness in radiated light entering the light-receiving portion 210, ultraviolet measurement, correction of the ultraviolet measurement, and illuminance measurement.

Since two first light-receiving elements PD1 and two second light-receiving elements PD2 are both diagonally arranged in the light receiver 201 according to the present modification, unevenness in incident radiated light and variation in sensitivity between light-receiving elements can be reduced. For this reason, the light receiver 201 can perform higher-precision corrective measurement and ultraviolet measurement.

Fourth Embodiment

Another embodiment of the present invention will be described with reference to FIGS. 20 and 22 as follows. Note that, for convenience of illustration, members having the same functions as those described in the above-described embodiments are denoted by the same reference characters, and a description of the members will be omitted.

<Correction>

A light receiver 101 shown in FIG. 20 can perform second corrective measurement, using a method different from that for the second corrective measurement described in the third embodiment.

(First Corrective Measurement)
(Denominator)

Like the third embodiment, the light receiver 101 performs first corrective measurement. Let ADC1_1st_clear and ADC2_1st_ir be respective digital output values ADCOUNT1 and ADCOUNT2 from A/D converters ADC1 and ADC2 in the first corrective measurement.

(Second Corrective Measurement)
(Numerator)

When the light receiver 101 performs the second corrective measurement, a sensor circuit portion 120 is in a second open/closed state shown in FIG. 20(b), and a light-receiving portion 10 is in a connection state shown in FIG. 22.

Thus, a photocurrent is extracted from a photodiode PD_ir of a first light-receiving element PD1 and is input to the A/D converter ADC2. A photocurrent is extracted from a photodiode PD_clear of a second light-receiving element PD2 and is input to the A/D converter ADC1.

Let ADC1_2nd_clear2 and ADC2_2nd_ir1 be the respective digital output values ADCOUNT1 and ADCOUNT2 from the A/D converters ADC1 and ADC2 in the second corrective measurement.

(Value of Unevenness in Radiated Light)

Letting Bias1 and Bias2 be respective values of unevenness in radiated light to the first light-receiving element PD1 and the second light-receiving element PD2, (Expression 15) and (Expression 16) below hold.

$$Bias1 = ADC2\_2nd\_ir1/ADC2\_1st\_ir \quad (15)$$

$$Bias2 = ADC1\_2nd\_clear2/ADC1\_1st\_clear \quad (16)$$

(Ultraviolet Measurement)
(Correction of Ultraviolet Measurement)

Like the third embodiment, the light receiver 101 performs ultraviolet measurement and correction of the ultraviolet measurement.

With the above-described configuration, the light-receiving portion 10 has sensitivity only to an ultraviolet region covering wavelengths not more than 400 nm, and a computation portion corrects ultraviolet intensity. This allows accurate measurement of ultraviolet intensity.

[Summary]

A light receiver according to a first aspect of the present invention is a light receiver including first and second light-receiving elements that each feed a photocurrent in accordance with intensity of incident light, and an optical filter in which transmittance of light in a first wavelength range is lower than transmittance of light outside the first wavelength range, in which the incident light after passage through the optical filter enters the first light-receiving element, the first and second light-receiving elements are arranged adjacent to each other and are switchable between a first state with sensitivity to light in the first wavelength range and a second state with sensitivity to light outside the first wavelength range, and a ratio between a first value that is a sum of photocurrents in the first and second light-receiving elements in the second state and a second value that is a photocurrent in the first or second light-receiving element in the second state is calculated as a value of unevenness in the incident light.

According to the above-described configuration, the first and second light-receiving elements can measure intensity of the incident light in the second state with sensitivity to light outside the first wavelength range. For this reason, unevenness in incident light on the first and second light-receiving elements outside the first wavelength range can be calculated.

The first and second light-receiving elements can measure the intensity of the incident light both in the first state with sensitivity to light in the first wavelength range and in the second state with sensitivity to light outside the first wavelength range. For this reason, a light-receiving element for measuring the unevenness in the incident light need not be provided separately from a measuring light-receiving element. This allows curbing of an increase in cost and an increase in light-receiving element formation area.

Since the first value is the sum of the photocurrents in the first and second light-receiving elements in the second state, the unevenness in the incident light on the first and second light-receiving elements is averaged. In the first value, variation in sensitivity between the first and second light-receiving elements and effects of the optical filter (outside the first wavelength range) are also averaged. Thus, the value of unevenness in the incident light includes the variation in sensitivity between the first and second light-receiving elements and the effects of the optical filter (outside the first wavelength range). That is, the unevenness in the incident light on the first and second light-receiving elements, the variation in sensitivity between the first and second light-receiving elements, and the effects of the optical filter can be calculated in combination.

Additionally, intensity of the incident light on the first and second light-receiving elements outside the first wavelength range can be measured.

A second aspect of the present invention is the light receiver according to the first aspect. Preferably, the first light-receiving element and the second light-receiving element have sensitivity to light in a second wavelength range outside the first wavelength range and sensitivity to light in a third wavelength range outside the first wavelength range, respectively, during a first period, the first light-receiving element and the second light-receiving element have sensitivity to light in the third wavelength range and sensitivity to light in the second wavelength range, respectively, during a second period, at least one of the first and second light-receiving elements has sensitivity to light in the second wavelength range during a third period, the first value is a sum of a photocurrent in the first light-receiving element during the first period and a photocurrent in the second light-receiving element during the second period, and the second value is a photocurrent in the first or second light-receiving element during the third period that has sensitivity to light in the second wavelength range during the third period.

According to the above-described configuration, since the first value is the sum of the photocurrents in the first light-receiving element during the first period and the second light-receiving element during the second period, unevenness in incident light on the first and second light-receiving elements in the second wavelength range is averaged. In the first value, variation in sensitivity between the first and second light-receiving elements in the second wavelength range and effects of the optical filter (in the second wavelength range) are also averaged. Thus, the value of unevenness in the incident light includes the variation in sensitivity between the first and second light-receiving elements and the effects of the optical filter (in the second wavelength range). That is, the unevenness in the incident light on the first and second light-receiving elements, the variation in sensitivity between the first and second light-receiving elements, and the effects of the optical filter in the second wavelength range can be calculated in combination.

Additionally, intensity of the incident light on the first and second light-receiving elements in the second wavelength range during the first and second periods can be measured.

A third aspect of the present invention is the light receiver according to the first or second aspect. Preferably, the photocurrents in the first and second light-receiving elements in the first state are corrected on the basis of the value of unevenness.

According to the above-described configuration, even if light is unevenly incident on the light-receiving elements, state detection results (light amounts) required to measure intensity of light in the first wavelength range can be corrected through measurement of intensity of light outside the first wavelength range. Thus, the intensity of light in the first wavelength range can be measured with higher precision, regardless of whether light uniformly enters the light-receiving elements.

Even with the variation in sensitivity between the first and second light-receiving elements and the effects of the optical filter (outside the first wavelength range), state detection results (light amounts) required to measure the intensity of light in the first wavelength range can be corrected through measurement of the intensity of light outside the first wavelength range. Thus, the intensity of light in the first wavelength range can be measured with higher precision, regardless of whether the light-receiving elements have uniform sensitivity and the effects of the optical filter outside the first wavelength range.

A fourth aspect of the present invention is the light receiver according to the third aspect. Preferably, the correction based on the value of unevenness is multiplication of the photocurrents in the first and second light-receiving elements in the first state by a reciprocal of the value of unevenness.

According to the above-described configuration, the intensity of light in the first wavelength range can be easily corrected.

A fifth aspect of the present invention is the light receiver according to any one of the first to fourth aspects. Preferably, the first and second light-receiving elements each include two or more photodiodes, and switching between the first and second states is performed through selective driving of the two or more photodiodes.

According to the above-described configuration, the first and second light-receiving elements can be manufactured by a semiconductor manufacturing process.

A sixth aspect of the present invention is the light receiver according to any one of the first to fifth aspects. Preferably, the first and second light-receiving elements have same layer structures.

The above-described configuration simplifies a manufacturing process and allows a reduction in manufacturing cost.

A seventh aspect of the present invention is the light receiver according to the sixth aspect. Preferably, each of the layer structures is a four-layer structure with a first layer, a second layer, a third layer, and a substrate.

According to above-described configuration, the first and second light-receiving elements can each include, at a single light-receiving surface, three photodiode junctions between the first layer and the second layer, between the second layer and the third layer, and between the third layer and the substrate. This downsizes the first and second light-receiving elements, increases the degree of flexibility in design of an apparatus including the light receiver according to the present aspect, and improves design.

An eighth aspect of the present invention is the light receiver according to the seventh aspect. Preferably, the four-layer structure has an N-type diffusion layer, a P-type well layer, an N-type well layer, and a P-type substrate or a P-type diffusion layer, an N-type well layer, a P-type well layer, and an N-type substrate.

The above-described configuration allows manufacture by a semiconductor manufacturing process.

A ninth aspect of the present invention is the light receiver according to the seventh or eighth aspect. Preferably, the photocurrent in each of the first and second light-receiving elements in the first state is extracted from the photodiode junction between the first layer and the second layer.

According to the above-described configuration, a short-wavelength range can be set as the first wavelength range.

A tenth aspect of the present invention is the light receiver according to any one of the seventh to ninth aspects. Preferably, the photocurrent in each of the first and second light-receiving elements in the second state is extracted from the photodiode junction between the second layer and the third layer, and/or the photodiode junction between the third layer and the substrate.

According to the above-described configuration, long-wavelength ranges can be set as the second and third wavelength ranges.

An 11th aspect of the present invention is the light receiver according to any one of the first to tenth aspects. Preferably, the first wavelength range is an ultraviolet region.

The above-described configuration allows measurement of intensity of ultraviolet rays.

A 12th aspect of the present invention is the light receiver according to the second aspect. Preferably, the second wavelength range is a visible light region and/or an infrared region, the third wavelength range is the visible light region and/or the infrared region, and the second and third wavelength ranges are wavelength ranges different from each other.

The above-described configuration allows measurement of intensity of ultraviolet rays, visible light, and infrared rays.

A 13th aspect of the present invention is the light receiver according to any one of the first to 12th aspects. Preferably, a plurality of first light-receiving elements constituting the first light-receiving element and a plurality of second light-receiving elements constituting the second light-receiving element are both diagonally arranged.

According to the above-described configuration, since the first and second light-receiving elements are alternately arranged, unevenness in incidence of incident light can be averaged.

A 14th aspect of the present invention is the light receiver according to any one of the first to 13th aspects. Preferably, the optical filter covers a whole or a part of a light-receiving surface of the first light-receiving element.

According to the above-described configuration, since the optical filter need not cover the whole of the light-receiving surface of the first light-receiving element, the degree of flexibility in design of the light receiver can be increased.

A portable electronic apparatus according to a 15th aspect of the present invention preferably includes the light receiver according to any one of the first to 14th aspects.

The above-described configuration allows curbing of an increase in cost and an increase in light-receiving element formation area and allows implementation of provision of a portable electronic apparatus capable of calculating unevenness in incident light.

Note that the present invention is not limited to the above-described embodiments and that various changes may be made within the scope of the claims. An embodiment obtained by appropriately combining technical means disclosed in different embodiments is also included in the technical scope of the present invention. Additionally, a new technical feature can be formed by combining technical means disclosed in the embodiments.

INDUSTRIAL APPLICABILITY

The present invention is suitably applicable to a light receiver to be loaded into a portable electronic apparatus, such as a smartphone.

REFERENCE SIGNS LIST 1, 101, 201 light receiver
10, 110, 210 light-receiving portion
11, 111 UV cutoff filter (optical filter)
12 shielding portion
20, 120 sensor circuit portion
22 charging circuit
23 comparison circuit
24 control circuit
25 discharging circuit
241 flip-flop, FF
242 counter
Iin, Iin1, Iin2 photocurrent
IN input terminal
ADC, ADC1, ADC2 A/D converter
ADCOUNT, ADCOUNT1, ADCOUNT2 digital output value
N N-type diffusion layer (first layer)
N-Well N-type well layer (third layer)
OUT output terminal
PD light-receiving element
PD1 first light-receiving element
PD2 second light-receiving element
PD_clear, PD_ir, PD_uv, PD_vis photodiode (photodiode junction)

P-Sub P-type substrate (substrate)

P-Well P-type well layer (second layer)

P+ P-type diffusion layer

SW1 to SW5, SW11 and SW12, SW21 and SW22, and SW31 and SW32 switch

The invention claimed is:

1. A light receiver comprising:

first and second light-receiving elements that each feed a photocurrent in accordance with intensity of incident light; and an optical filter in which transmittance of light in a first wavelength range is lower than transmittance of light outside the first wavelength range, wherein the incident light after passage through the optical filter enters the first light-receiving element, the first and second light-receiving elements are arranged adjacent to each other and are switchable between a first state with sensitivity to light in the first wavelength range and a second state with sensitivity to light outside the first wavelength range, and a ratio between a first value that is a sum of photocurrents in the first and second light-receiving elements in the second state and a second value that is a photocurrent in the first or second light-receiving element in the second state is calculated as a value of unevenness in the incident light.

2. The light receiver according to claim 1, wherein the first light-receiving element and the second light-receiving element have sensitivity to light in a second wavelength range outside the first wavelength range and sensitivity to light in a third wavelength range outside the first wavelength range, respectively, during a first period, the first light-receiving element and the second light-receiving element have sensitivity to light in the third wavelength range and sensitivity to light in the second wavelength range, respectively, during a second period, at least one of the first and second light-receiving elements has sensitivity to light in the second wavelength range during a third period, the first value is a sum of a photocurrent in the first light-receiving element during the first period and a photocurrent in the second light-receiving element during the second period, and the second value is a photocurrent in the first or second light-receiving element during the third period that has sensitivity to light in the second wavelength range during the third period.

3. The light receiver according to claim 1, wherein the photocurrents in the first and second light-receiving elements in the first state are corrected on the basis of the value of unevenness.

4. The light receiver according to claim 1, wherein the first wavelength range is an ultraviolet region.

5. A portable electronic apparatus comprising a light receiver according to claim 1.

* * * * *